(12) United States Patent
Hsiao et al.

(10) Patent No.: US 12,114,450 B2
(45) Date of Patent: Oct. 8, 2024

(54) ELECTRONIC DEVICE

(71) Applicant: Wiwynn Corporation, New Taipei (TW)

(72) Inventors: Ching-Wen Hsiao, New Taipei (TW); Chia-Hung Yen, New Taipei (TW)

(73) Assignee: WIWYNN CORPORATION, New Taipei (TW)

( * ) Notice: Subject to any disclaimer, the term of this patent is extended or adjusted under 35 U.S.C. 154(b) by 217 days.

(21) Appl. No.: 18/051,898

(22) Filed: Nov. 2, 2022

(65) Prior Publication Data

US 2024/0098920 A1    Mar. 21, 2024

(30) Foreign Application Priority Data

Sep. 20, 2022 (TW) .................................. 111135617

(51) Int. Cl.
| | |
|---|---|
| *H04N 23/13* | (2023.01) |
| *G01N 27/12* | (2006.01) |
| *G01R 33/07* | (2006.01) |
| *H05K 5/02* | (2006.01) |
| *H05K 5/03* | (2006.01) |

(52) U.S. Cl.
CPC ......... *H05K 5/0247* (2013.01); *G01N 27/129* (2013.01); *G01R 33/072* (2013.01); *H04N 23/13* (2023.01); *H05K 5/0217* (2013.01); *H05K 5/03* (2013.01)

(58) Field of Classification Search
None
See application file for complete search history.

(56) References Cited

U.S. PATENT DOCUMENTS

| | | | | |
|---|---|---|---|---|
| 5,463,595 A | * | 10/1995 | Rodhall | G08B 13/00 340/426.25 |
| 9,030,321 B2 | * | 5/2015 | Breed | G01S 13/04 455/39 |
| 11,521,480 B1 | | 12/2022 | Wu et al. | |

(Continued)

FOREIGN PATENT DOCUMENTS

| | | |
|---|---|---|
| CN | 109857209 A | 6/2019 |
| TW | I767773 B | 6/2022 |

OTHER PUBLICATIONS

Examination report dated Apr. 11, 2023, listed in related Taiwan patent application No. 111135617.

*Primary Examiner* — Xanthia C Relford
*Assistant Examiner* — Xanthia C Cunningham
(74) *Attorney, Agent, or Firm* — McClure, Qualey & Rodack, LLP

(57) ABSTRACT

An electronic device includes a base, a multi-stage sensor, a top cover, and a side cover. The multi-stage sensor is configured to sense a sensed area. The top cover includes a top-sensed element, and the top cover is detachably connected to a top side of the base, so that the top-sensed element can be selectively in or not in the sensed area. The side cover includes a side-sensed element, and the side cover is detachably adjacent to a front side of the base, so that the side-sensed element can be selectively in or not in the sensed area. In response to that only the top-sensed element is in the sensed area, the multi-stage sensor outputs a first signal. In response to that neither the top-sensed element nor the side-sensed element is in the sensed area, the multi-stage sensor outputs a second signal.

26 Claims, 21 Drawing Sheets

(56) References Cited

U.S. PATENT DOCUMENTS

| | | | |
|---|---|---|---|
| 2007/0126583 A1* | 6/2007 | Maniwa | G01S 13/75 340/572.2 |
| 2008/0046625 A1* | 2/2008 | Spano | G06F 1/1677 710/302 |
| 2011/0210754 A1* | 9/2011 | Shen | G06F 1/1677 324/686 |
| 2019/0018462 A1* | 1/2019 | Chan | G06F 1/166 |
| 2024/0072498 A1* | 2/2024 | Hu | F04D 29/601 |

* cited by examiner

ELECTRONIC DEVICE

CROSS-REFERENCE TO RELATED APPLICATION

This non-provisional application claims priority under 35 U.S.C. § 119(a) to Patent Application No. 111135617 filed in Taiwan, R.O.C. on Sep. 20, 2022, and the entire contents of which are hereby incorporated by reference.

BACKGROUND

Technical Field

The instant disclosure relates to an electronic device, particularly to an electronic device adapted to sense opened states of a plurality of covers thereof in a multi-stage manner.

Related Art

A box-type device usually has top and side covers. For specific purposes, these top and/or side covers can be designed as openable covers, respectively. However, based on certain situations and specific purposes, it would be necessary to prevent these openable top and/or side covers from being discretionarily opened; even more, it would be necessary to sense the connection state of these top and/or side covers to make sure whether they are already discretionarily opened or not.

SUMMARY

Accordingly, in some embodiments, an electronic device comprising a base, a multi-stage sensor, a top cover, and a side cover is provided. The multi-stage sensor is configured to sense a sensed area. The top cover comprises a top-sensed element. The top cover is detachably connected to a top side of the base to have the top-sensed element be selectively in or not in the sensed area. The side cover comprises a side-sensed element. The side cover is detachably adjacent to a front side of the base to have the side-sensed element be selectively in or not in the sensed area. The multi-stage sensor outputs a first signal in response to that only the top-sensed element is in the sensed area; and the multi-stage sensor outputs a second signal in response to that neither the top-sensed element nor the side-sensed element is in the sensed area.

In some embodiments, the side cover comprises a side cover body pivotally connected to the top cover and connected to the side-sensed element. The side cover body is pivotally rotatable with respect to the top cover to have the side-sensed element be selectively in or not in the sensed area.

In some embodiments, the side cover comprises a side cover body detachably connected to the front side of the base and connected to the side-sensed element. The side cover body is moveable with respect to the base to have the side-sensed element be selectively in or not in the sensed area.

In some embodiments, the multi-stage sensor comprises a sensing arm extending in the sensed area. The sensing arm has a first sensed quantity in response to that only the top-sensed element is in the sensed area. The sensing arm has a second sensed quantity in response to that neither the top-sensed element nor the side-sensed element is in the sensed area. The sensing arm has a third sensed quantity in response to that only the side-sensed element is in the sensed area. The first sensed quantity, the second sensed quantity, and the third sensed quantity are substantially different from each other. The multi-stage sensor outputs the first signal, the second signal, and a third signal respectively in response to that the sensing arm has the first sensed quantity, the second sensed quantity, and the third sensed quantity.

In some embodiments, the multi-stage sensor is a multi-stage switch comprising a first stage switch, a second stage switch, and a third stage switch. The first stage switch is electrically conducted in response to that the sensing arm has the first sensed quantity. The second stage switch is electrically conducted in response to that the sensing arm has the second sensed quantity. The third stage switch is electrically conducted in response to that the sensing arm has the third sensed quantity.

In some embodiments, the multi-stage sensor is a variable resistance sensor. The variable resistance sensor outputs the first signal, the second signal, and the third signal corresponding to the first sensed quantity, the second sensed quantity, and the third sensed quantity of the sensing arm according to the first sensed quantity, the second sensed quantity, and the third sensed quantity of the sensing arm.

In some embodiments, the side-sensed element is pivotally connected to the side cover body and the multi-stage sensor is a light sensor. The light sensor is a light distance sensor, and the light distance sensor emits an emitted light along a direction toward the top cover. The light distance sensor outputs the first signal corresponding to a distance from the emitted light to the top-sensed element in response to that only the top-sensed element is in the sensed area. The light distance sensor outputs a third signal corresponding to a distance from the emitted light to the side-sensed element in response to that only the side-sensed element is in the sensed area.

In some embodiments, the side-sensed element is pivotally connected to the side cover body, the multi-stage sensor is a light sensor, and the light sensor is a light color sensor. The top-sensed element has a top element color, and the side-sensed element has a side element color. The top element color is substantially different from the side element color. The light color sensor emits an emitted light along a direction toward the top cover. In response to that only the top-sensed element is in the sensed area, the light color sensor receives a reflected light having a color similar to the top element color to output the first signal. In response to that only the side-sensed element is in the sensed area, the light color sensor receives a reflected light having a color similar to the side element color to output a third signal.

In some embodiments, the side-sensed element is pivotally connected to the side cover body and the multi-stage sensor is a Hall sensor. The top-sensed element comprises a top magnet and the side-sensed element comprises a side magnet. The Hall sensor outputs the first signal corresponding to a magnetic flux of the top magnet in response to that only the top-sensed element is in the sensed area. The Hall sensor outputs a third signal corresponding to a magnetic flux of the side magnet in response to that only the side-sensed element is in the sensed area.

To sum up, an electronic device according to some embodiments having sensed elements (which are disposed on two adjacent covers, respectively) and a multi-stage sensor is provided. Through the sensed quantity of the sensed element corresponding to each of the multi-stage opened states of the covers sensed by the multi-stage sensor, the electronic device according to some embodiments can output corresponding signals respectively according to the sensed quantities, so that the opened state of each of the covers can be obtained in real time. In this way, according to some embodiments, the multi-stage sensor and/or the controlling unit (even the covers) of the electronic device can be given further corresponding treatment in a short time according to the multi-stage opened state of the covers. Therefore, the electronic device according to some embodiments can be used to avoid unnecessary or even irreparable loss or damage to the electronic device itself or the contents loaded in the electronic device.

DETAILED DESCRIPTION

Figure 1A:
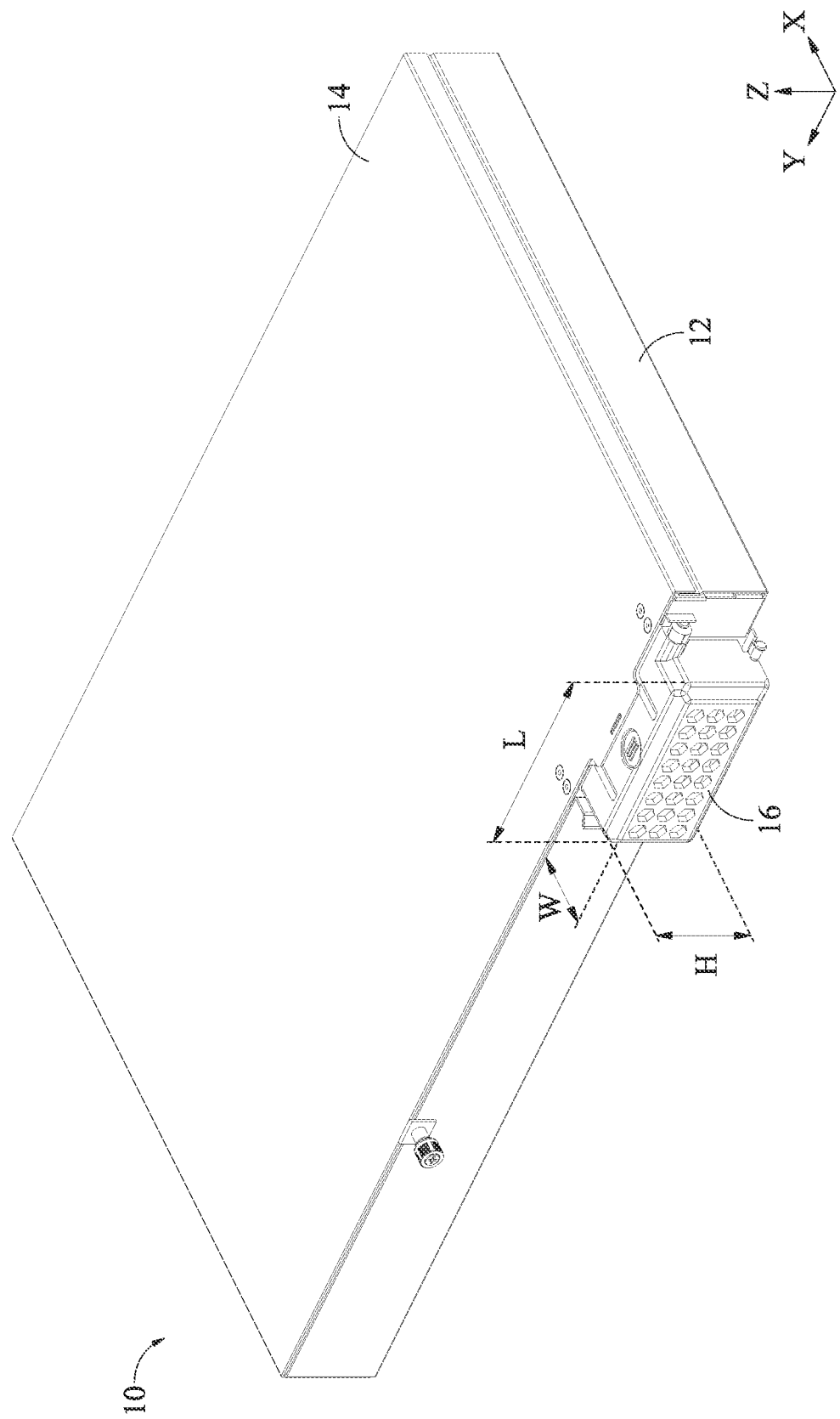
FIG. 1A illustrates a schematic perspective view of an electronic device according to some embodiments.
Figure 1B:
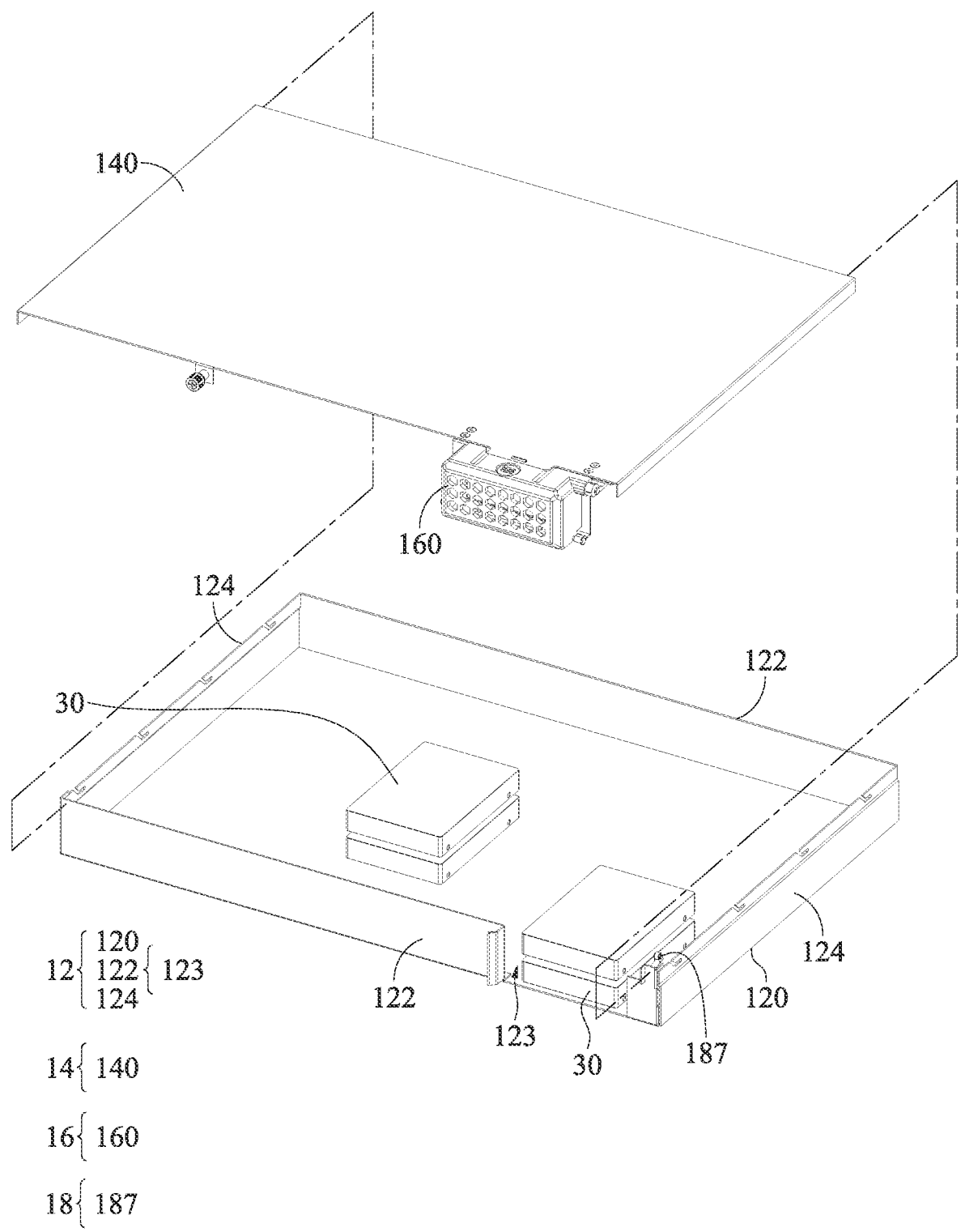
FIG. 1B illustrates an exploded schematic perspective view of the electronic device shown in FIG. 1A.

Please refer to FIG. 1A and FIG. 1B. FIG. 1A illustrates a schematic perspective view of an electronic device 10 according to some embodiments and FIG. 1B illustrates an exploded schematic perspective view of the electronic device 10 shown in FIG. 1A. In FIG. 1A and FIG. 1B, an electronic device 10 comprises a base 12, a multi-stage sensor 18, a top cover 14, and a side cover 16. The base 12 comprises a bottom plate 120, two first side walls 122, and two second side walls 124. The first side walls 122, the second side walls 124, and the bottom plate 120 are connected to each other. The side cover 16 is detachably connected to the top cover 14; for example, the side cover 16 is detachably connected to the top cover 14 or the base 12 to have the side cover 16 be on a front side of the base 12. The term "detachably" refers to an arrangement in which two elements can be temporarily or permanently separated by pivoting, sliding, or snapping. The materials of the base 12, the top cover 14, and the side cover 16 can be adjusted respectively according to various requirements; for example, the materials can respectively be at least one selected from the group consisting of plastic, rubber, metal, alloy, and ceramic.

Figure 2A:
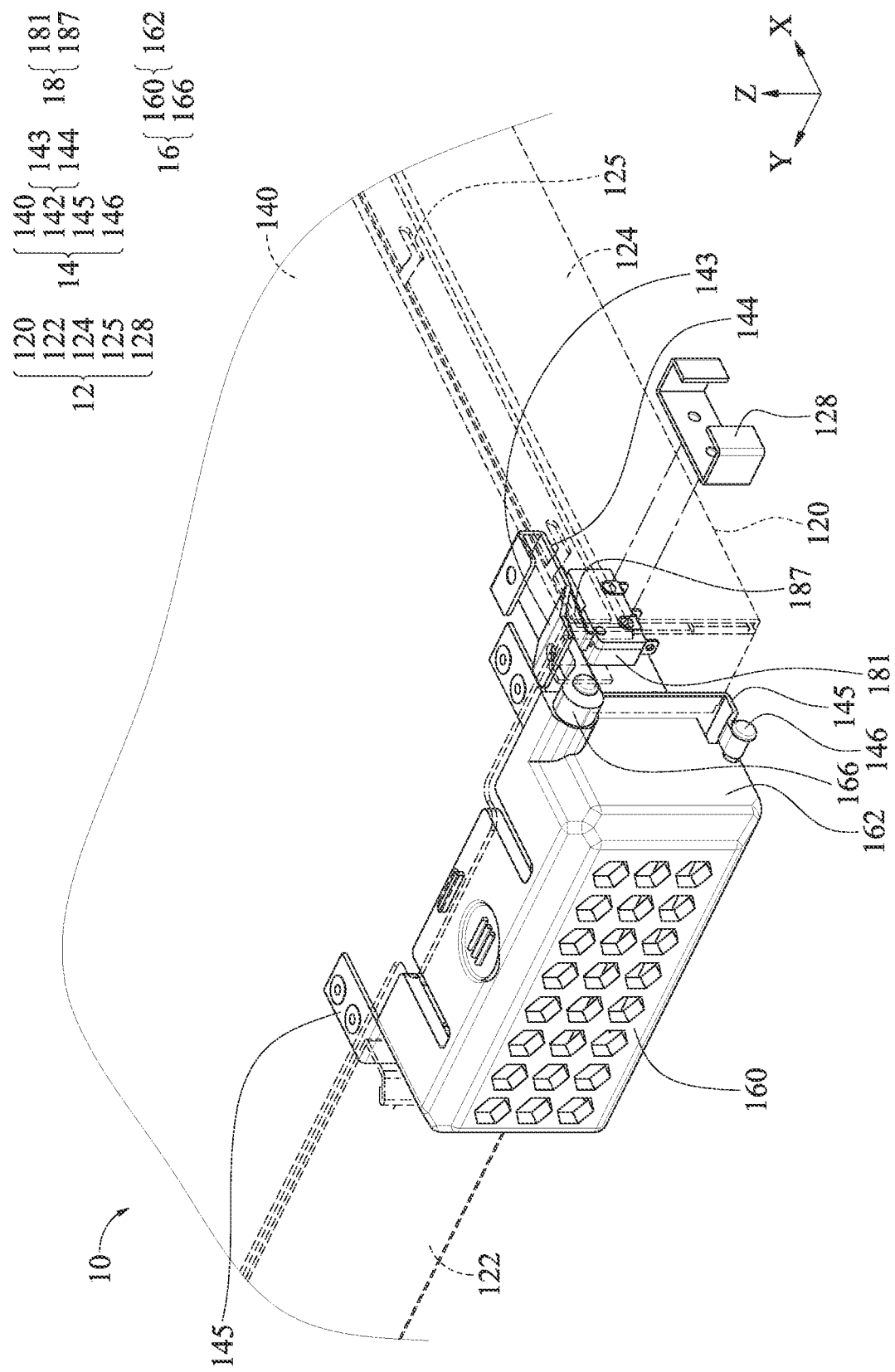
FIG. 2A illustrates an enlarged partial perspective view of the electronic device shown in FIG. 1A.
Figure 3A:
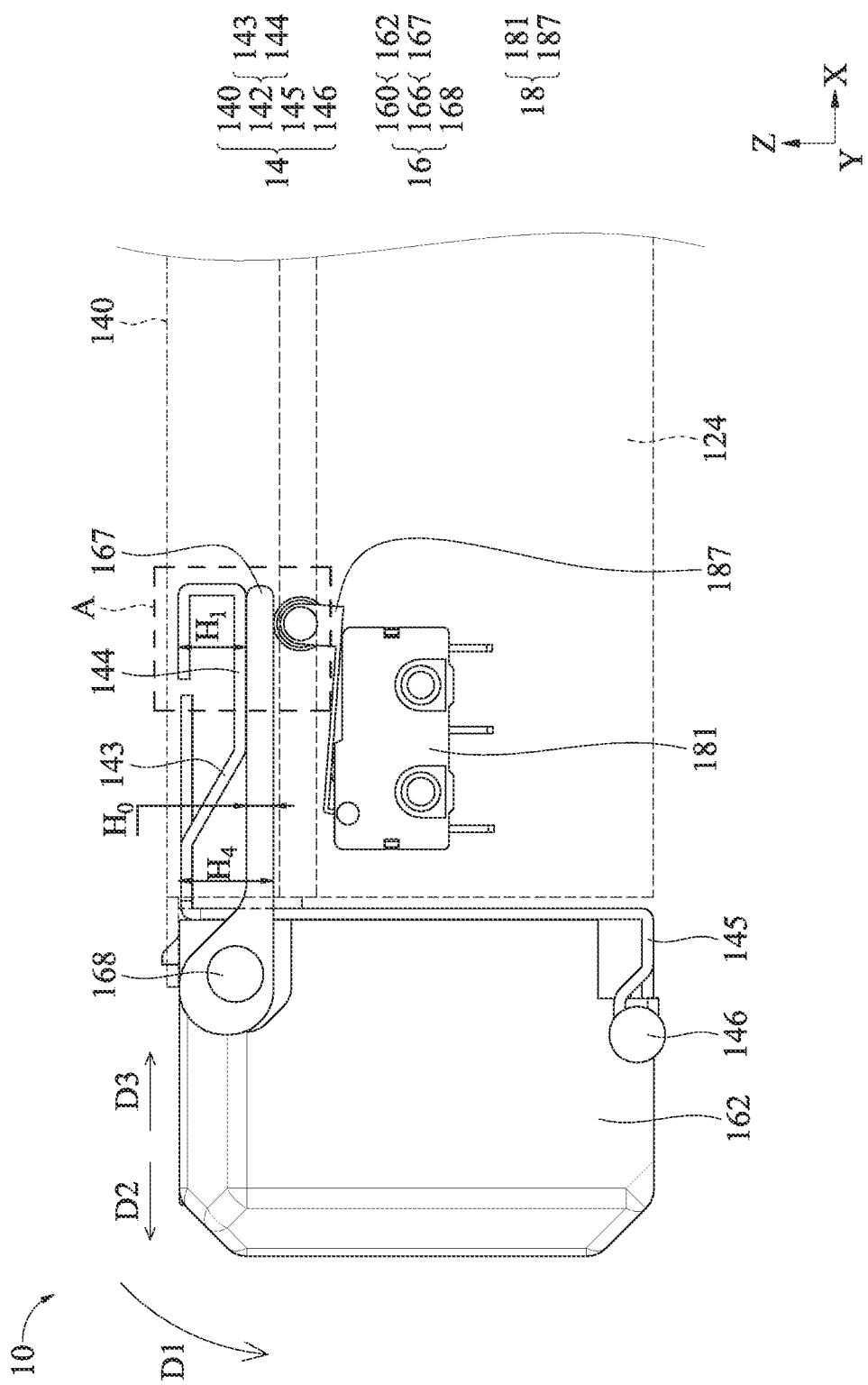
FIG. 3A illustrates a side perspective view of an electronic device according to some embodiments, wherein the electronic device is in an unopened state.

Please refer to FIG. 2A and FIG. 3A. FIG. 2A illustrates an enlarged partial perspective view of the electronic device 10 shown in FIG. 1A and FIG. 3A illustrates a side perspective view of an electronic device 10 according to some embodiments, wherein the electronic device 10 is in an unopened state. In FIG. 2A and FIG. 3A, a sensed area A (shown in FIG. 3A) is at or near the connection between the top cover 14 and the side cover 16. The top cover 14 comprises a top-sensed element 142, and the side cover 16 comprises a side-sensed element 166. The top-sensed element 142 and the side-sensed element 166 can be selectively in or not in the sensed area A, respectively. The multi-stage sensor 18 is configured to sense the top-sensed element 142 and the side-sensed element 166 that are in or not in the sensed area A. In response to that only the top-sensed element 142 is in the sensed area A, the multi-stage sensor 18 senses the top-sensed element 142 and outputs a first signal. In response to that neither the top-sensed element 142 nor the side-sensed element 166 is in the sensed area A, the multi-stage sensor 18 outputs a second signal. The first signal is substantially different from the second signal. In this way, through the first signal and the second signal sensed by the multi-stage sensor 18, various opened states of the top cover 14 and the side cover 16 can be obtained (i.e., in this embodiment, the top cover 14 and the side cover 16 together provide a multi-stage opened state). Accordingly, the top cover 14 and/or the side cover 16 of the electronic device 10 can be given further corresponding treatment in a short time according to the multi-stage opened state of the top cover 14 and the side cover 16, thereby avoiding unnecessary or even irreparable loss or damage to the electronic device 10 itself or its contents loaded in the electronic device 10.

For example, please refer again to FIG. 1B. In some embodiments, the electronic device 10 is adapted to load other contents 30, such as various components or equipment. Hence, the electronic device 10 can further be an electronic device 10 having a function of protecting the contents 30. More specifically, in some embodiments, the contents 30 comprise a circuit board, a processor, a heat sink, and a power supply, and the electronic device 10 loading these contents 30 can be used as a cloud server or an edge sever with a function of preventing the covers from being damaged. Therefore, according to the signals that sensed and output by the multi-stage sensor 18, the corresponding emergency treatment can be further triggered (for example, with respect to different opened states, corresponding logs can be generated, the server device can be locked or formatted, and even an alarm can be issued). Based on this, the electronic device 10 can be used to sense whether the electronic device 10 has been opened or whether the contents 30 have been replaced during the process from the factory to the completion of deployment, and can be even used to sense whether the electronic device 10 has been unauthorizedly opened or operated after the completion of deployment or power-on with corresponding treatment(s) given to each situation. Accordingly, the electronic device 10 can avoid unnecessary or even irreparable loss or damage to the electronic device 10 itself or the contents loaded in the electronic device 10 in time.

Please refer again to FIG. 1A and FIG. 1B. In some embodiments, the side cover 16 corresponds to an opening 123 of the base 12, and the side cover 16 may have a side cover length L, a side cover width W, and a side cover height H. The side cover length L, the side cover width W, and the side cover height H can be adjusted according to the opening 123 or other requirements. For example, as for an electronic device 10 used as a server, the electronic device 10 may have a shorter or a longer side cover length L to meet the electronic device 10 with a small form factor (SFF) or a large form factor (LFF) specification. Therefore, the electronic device 10 can be used to load a single component or a plurality of integrated components (such as storage components, network interface controllers (NICs), data center security control modules (DC-SCMs), and cables).

The implementations of the description "the top cover 14 is detachably connected to the top side of the base 12" are provided in the following embodiments, but the instant disclosure is not limited thereto.

According to some embodiments, referring to FIG. 2A and FIG. 3A at the same time, the top cover 14 is slidably disposed on the base 12 to have the top-sensed element 12 be selectively in or not in the sensed area A. Correspondingly, a sliding assembly element (not denoted) is between the top cover 14 and the base 12; for example, a second side wall 124 of the base 12 has a sliding rail corresponding to the top cover 14, and a convex portion (not shown) corresponding to the sliding rail is disposed on the top cover 14, so that the top cover 14 can be matched and thus nondetachably moveable on the base 12. For example, the slide rail of the base 12 further has one or more grooves 125, and the convex portion of the top cover 14 is detachably and slidably disposed into the grooves 125 of the base 12, so that the top cover 14 is detachably fixed to the base 12.

The implementations of the description "the side cover 16 is detachably on the front side of the base 12" are provided in the following embodiment, but the instant disclosure is not limited thereto.

Figure 3B:
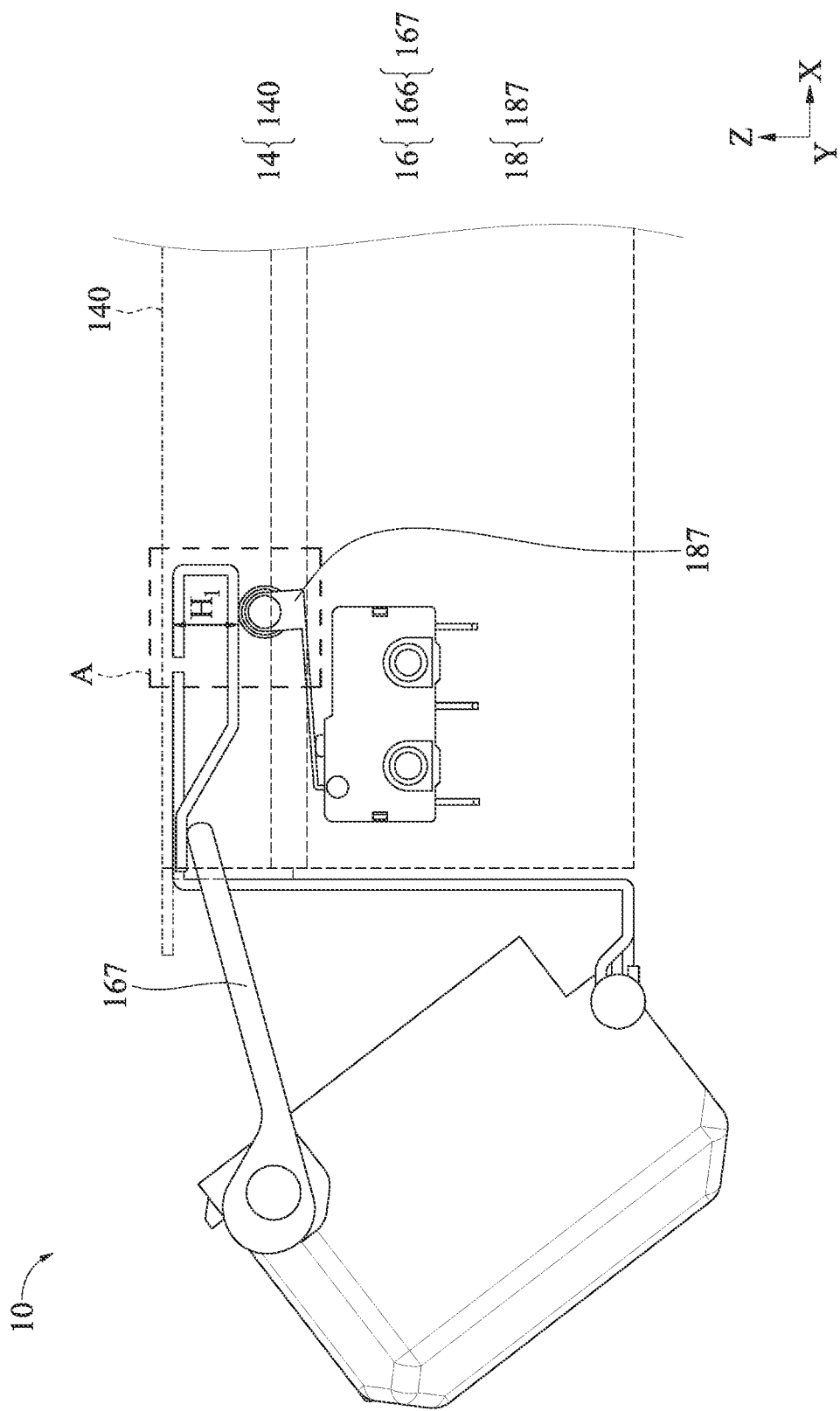
FIG. 3B illustrates a side perspective view of an electronic device according to some embodiments, wherein the electronic device is in a first opened state.

According to some embodiments, referring to FIG. 2A and FIG. 3A at the same time, the side cover 16 comprises a side cover body 160 pivotally connected to the top cover 14. The side cover body 160 is connected to the side-sensed element 166, and the side cover body 160 is pivotally rotatable with respect to the top cover 14 to have the side-sensed element 166 be selectively in or not in the sensed area A. In FIG. 2A and FIG. 3A, the top cover 14 comprises a top cover body 140 and a connecting element 145. A first end (not denoted) of the connecting element 145 is fixed to the top cover body 140, and a second end (not denoted) of the connecting element 145 extends to the front side of the base 12 (for example, the first side wall 122 of the base 12). The materials of the connecting element 145 can be adjusted according to various requirements; for example, the materials can be at least one selected from the group consisting of plastic, rubber, metal, alloy, and ceramic. For example, the side cover body 160 can be pivotally connected to the second end of the connecting element 145 by a first shafting element 146 to have the side cover body 160 be rotatable with respect to the top cover 14. The first shafting element 146 can be a torsion spring, a bearing, or a screw. Therefore, when the side cover body 160 is pivotally rotated in a direction away from the base 12 (for example, the first direction D1 in FIG. 3A; that is, a counterclockwise direction), the side-sensed element 166 connected to the side cover body 160 is moved away from the base 12 at the same time to have a portion of the side-sensed element 166 or the entire of the side-sensed element 166 be not in the sensed area A (as shown in FIG. 3B). Conversely, when the side cover body 160 is pivotally rotated in a direction approaching to the base 12 (for example, a clockwise direction in FIG. 3A), the side-sensed element 166 connected to the side cover body 160 is moved to the base 12 at the same time to have a portion of the side-sensed element 166 or the entire of the side-sensed element 166 be in the sensed area A. Based on this, an electronic device 10 according to some embodiments can have two opened states (that is, the top cover 14 and the top cover 16 of the electronic device 10 together provides a two-stage open state); one of the two states is a state that only the side cover 16 is opened (referred to as a first opened state), and the other state is a state that the side cover 16 and the top cover 14 are opened at the same time, wherein the side cover 16 is opened due to the opened top cover 14 (referred to as a second opened state). Therefore, in combination with the multi-stage sensor 18, the electronic device 10 according to some embodiments can respectively sense and obtain the two-stage opened state of the top cover 14 and the side cover 16.

Figure 4A:
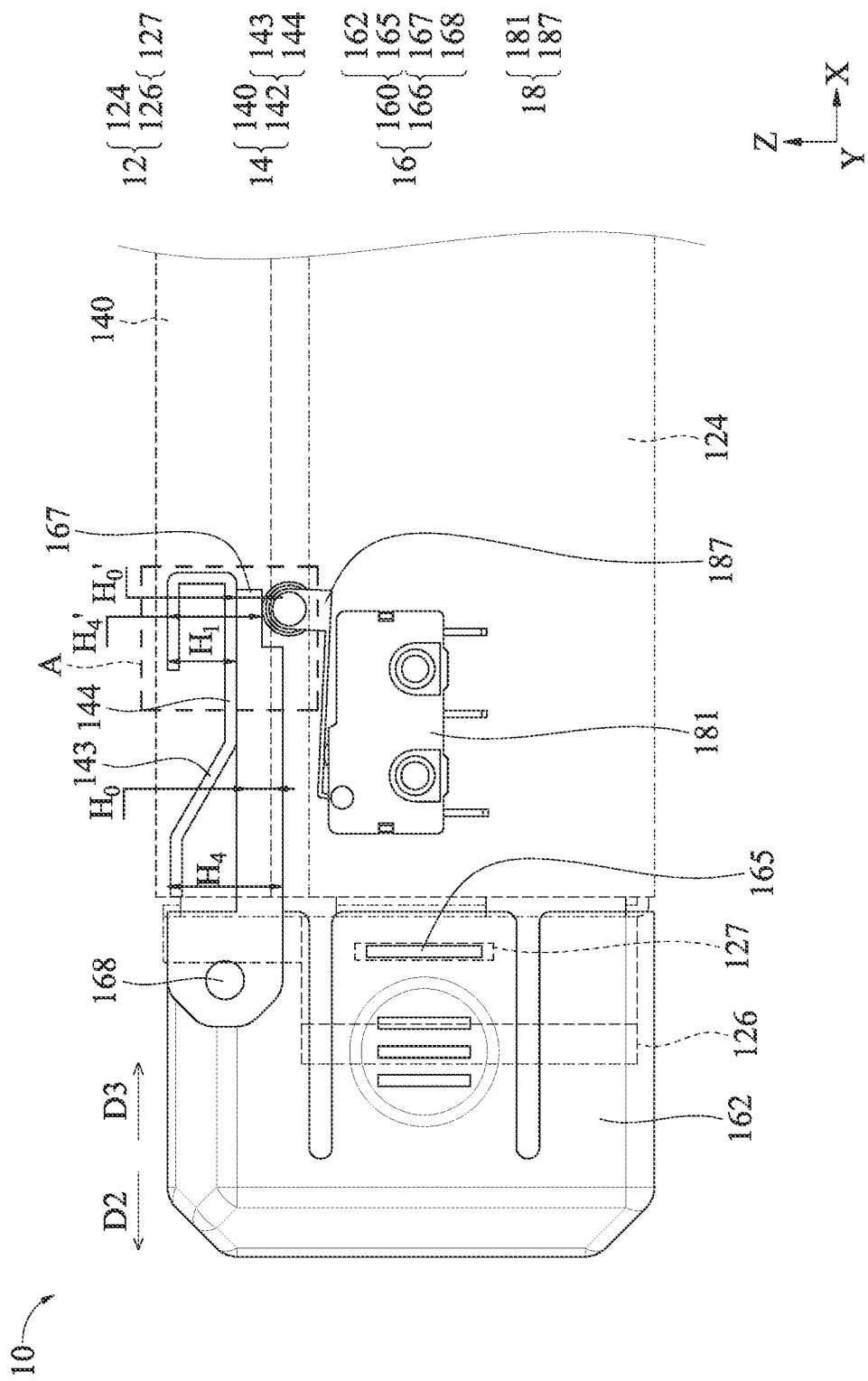
FIG. 4A illustrates a side perspective view of an electronic device according to some embodiments, wherein the electronic device is in an unopened state.

In some embodiments, referring to FIG. 4A, FIG. 4A illustrates a side perspective view of an electronic device 10 according to some embodiments, wherein the electronic device 10 is in an unopened state. In FIG. 4A, the second side wall 124 of the base 12 has one or more first fixing elements 126. The first fixing elements 126 can be disposed on one side or multiple sides of the base 12 corresponding to the side cover body 160 to detachably fix to the side cover body 160. For example, each of the first fixing elements 126 has a first assembly portion 127, the side cover body 160 has side cover walls 162 (shown in FIG. 2A), and each of the side cover walls 162 has a second assembly portion 165 corresponding to the first assembly portion 127. By detachably connecting the first assembly portion 127 and the second assembly portion 165, the first assembly portion 127 is substantially matched to the second assembly portion 165 to have the side cover 16 be detachably connected to the base 12. For example, by clamping the second assembly portion 165 to the first assembly portion 127, the first assembly portion 127 can be a groove or a concave hole, and the second assembly portion 165 can be a convex portion, so that the side cover 16 can be detachably connected to the base 12. Conversely, the first assembly portion 127 can be a convex portion, and the second assembly portion 165 can be a groove or a concave hole, so that the side cover 16 can be detachably connected to the base 12. Hence, when the side cover body 160 is moved in a direction away from the base 12 (for example, a second direction D2), the side-sensed element 166 connected to the side cover body 160 is moved away from the base 12 at the same time to have a portion of the side-sensed element 166 or the entire of the side-sensed element 166 be not in the sensed area A. Conversely, when the side cover body 160 is moved in a direction approaching to the base 12 (for example, a third direction D3), the side-sensed element 166 connected to the side cover body 160 is moved to the base 12 at the same time to have a portion of the side-sensed element 166 or the entire of the side-sensed element 166 be in the sensed area A. Based on this, an electronic device 10 according to some embodiments can have three opened states (that is, in this embodiment, the top cover 14 and the side cover 16 of the electronic device 10 can together have a three-stage open state); one of the states is a state that only the side cover 16 is opened (referred to as a first opened state), another state is a state that both the top cover 14 and the side cover 16 are opened (referred to as a second opened state), and the other state is a state that only the top cover 14 is opened (referred to as a third opened state). Therefore, in combination with the multi-stage sensor 18, the electronic device 10 according to some embodiments can respectively sense and obtain a three-stage opened state of the top cover 14 and the side cover 16.

Furthermore, according to some embodiments, referring to FIG. 1A, the side cover body 160 (or the side wall of the base 12) may have one or more windows (not denoted) on a side of the side cover body 160 that is away from the base 12. Therefore, through the windows and the openings 123 corresponding to the windows (shown in FIG. 1B), an electronic device 10 according to some embodiments can be used to quickly observe or monitor the contents 30 loaded in the electronic device 10 without damaging or opening the side cover 16. Moreover, through the windows and the corresponding openings 123 (shown FIG. 1B), in some embodiments, the contents 30 can also achieve the effect of heat dissipation.

The implementations of the description "the top-sensed element 142" and "the side-sensed element 166" are provided in the following embodiment, but the instant disclosure is not limited thereto.

In some embodiments, referring to FIG. 3A, the top cover 14 comprises a top cover body 140 and a top-sensed element 142. Two ends of the top cover body 140 are slidably disposed on a top side of the base 12, respectively. The top-sensed element 142 is on a side of the top cover body 140 that faces the base 12, and a height is between the top-sensed element 142 and the top cover body 140 (for example, a first height $H_1$, which will be described later). For example, in FIG. 3A, the top-sensed element 142 is a folded piece having a guiding bevel 143 and a guiding plane 144, and the guiding bevel 143 and the guiding plane 144 are connected to each other. The guiding bevel 143 is on a side of the top-sensed element 142 adjacent to the side cover 16 and corresponds to the side-sensed element 166, and the guiding plane 144 is on a side of the top-sensed element 142 away from the side cover 16. The height of the guiding bevel 143 can be configured to increase along the direction toward the guiding plane 144. The side-sensed element 166 has an extending portion 167 extending along a direction away from the side cover 16. When the side-sensed element 166 is moved in a direction toward the sensed area A (for example, the third direction D3), the extending portion 167 can be moved to abut against the guiding bevel 143 and be guided to the guiding plane 144. Conversely, when the side-sensed element 166 is moved in a direction away from the sensed area A (for example, the second direction D2), the extending portion 167 can be moved to abut against the guiding bevel 143 and be guided away from the guiding plane 144. Therefore, through the guiding bevel 143, the side-sensed element 166 can be moved in the sensed area A more stably.

According to some embodiments, in FIG. 3A, the distance between the guiding plane 144 of the top-sensed element 142 and the top cover body 140 is the first height $H_1$, and the extending portion 167 of the side-sensed element 166 has a thickness $H_0$. Therefore, when the extending portion 167 abuts against the top-sensed element 142 (that is, the guiding plane 144), a distance between the top cover body 140 and the surface of the extending portion 167 that is near a side of the base 12 is a fourth height $H_4$. In other words, in this embodiment, the fourth height $H_4$ is the sum of the first height $H_1$ and the thickness $H_0$ of the side-sensed element 166.

Referring to FIG. 4A, according to some embodiments, one of two ends of the extending portion 167 that is near the side cover 16 (hereinafter, referred to as a head end; not denoted) and the other end of the extending portion 167 that is away from the side cover 16 (hereinafter, referred to as a tail end; not denoted) may have different thicknesses. For example, in FIG. 4A, the head end and the tail end of the extending portion 167 can respectively have a thickness $H_0$ and a thickness $H_{0'}$, and the thickness $H_0$ of the head end is greater than the thickness $H_{0'}$ of the tail end. Hence, the distance between the top cover body 140 and the surface of the head end adjacent to the base 12 is the fourth height $H_4$, and the distance between the top cover body 140 and the surface of the tail end near the base 12 is the fourth height $H_{4'}$. In this way, through a stepped portion (not denoted) formed at the tail end due to the different thicknesses of different portions of the side-sensed element 166 (that is, the extending portion 167), a sensing arm 187 of the multi-stage sensor 18 (which will be described later) can be guided and limited at the stepped portion more easily. Based on this, as long as the sensing arm 187 is not disposed at the stepped portion whose length is apparently less than the length of the extending portion 167, the opened state of the side-sensed element 166 and the corresponding side cover 16 can be sensed and observed quickly and sensitively.

Figure 2B:
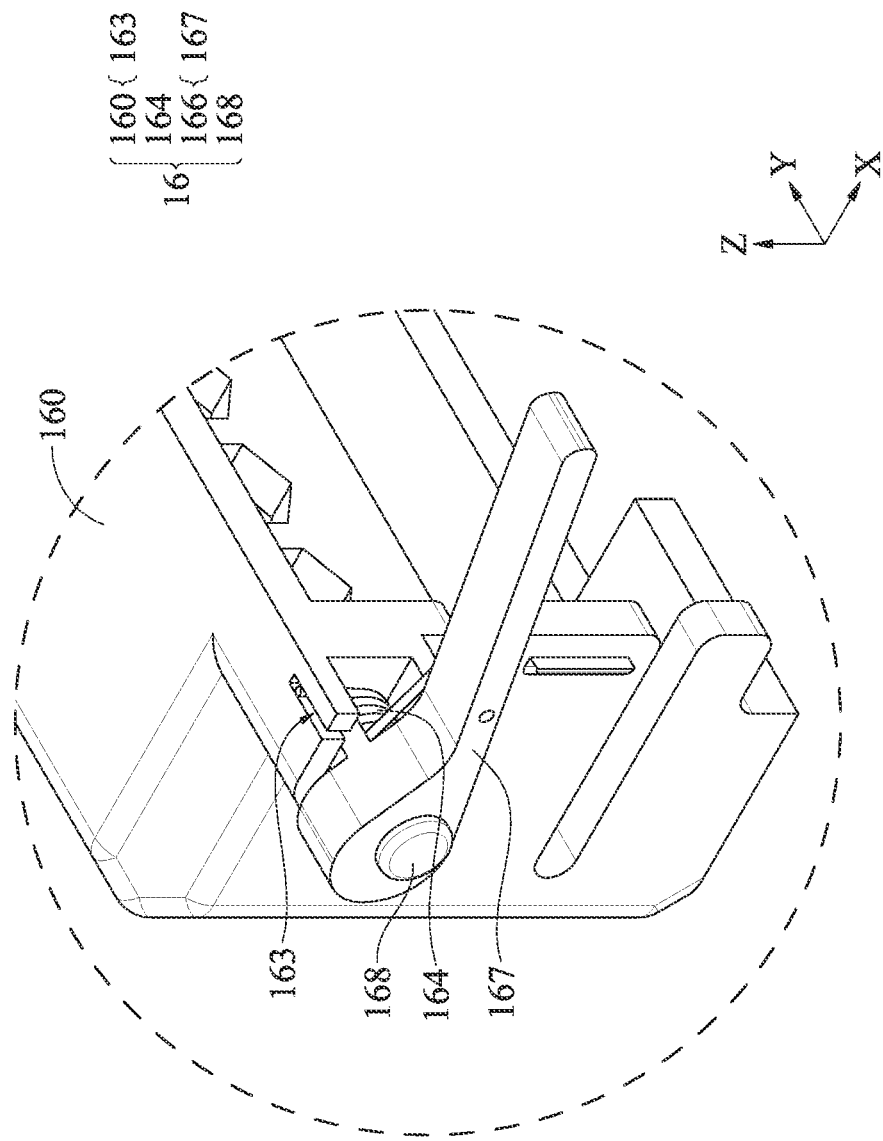
FIG. 2B illustrates an enlarged partial perspective view of a side cover according to some embodiments.

Please refer to FIG. 2B. FIG. 2B illustrates an enlarged partial perspective view of a side cover 16 according to some embodiments. In some embodiments, the side-sensed element 166 is pivotally connected to the side cover body 160. For example, in FIG. 2B, the side cover 16 comprises a second shafting element 168 and a torsion spring 164. The torsion spring 164 is between the side cover body 160 and the side-sensed element 166, and the second shafting element 168 is fitted over the torsion spring 164 to have the side-sensed element 166 be pivotally rotatable with respect to the side cover body 160. The side cover 16 may further have a limiting slot 163 corresponding to the torsion spring 164. A first end (not denoted) of the torsion spring 164 is fixed to the limiting slot 163, and a second end (not denoted) of the torsion spring 164 is fixed to the side-sensed element 166. Hence, when the torsion spring 164 has a torsion force along the counterclockwise direction at the XZ plane (that is, in this embodiment, the first direction D1 in FIG. 3A), the torsion force normally forces the side-sensed element 166 to be moved along the counterclockwise direction in FIG. 3A.

Referring to FIG. 2A and FIG. 3A, in some embodiments, the side-sensed element 166 is fixed to the side cover body 160 and is neither pivotally rotatable nor moveable with respect to the side cover body 160. Hence, when the top cover 14 is moved in a direction away from the side cover body 160 and thus the side-sensed element 166 cannot further abut against the top cover 14 (that is, the top cover 14 is in an opened state), the side-sensed element 166 will not be pivotally rotatable with respect to the side cover body 160. Therefore, an electronic device 10 according to some embodiments is adapted to obtain the two-stage opened state comprising the state that the side cover 16 is not in the sensed area A (that is, the first opened state) and the state that neither the side cover 16 nor the top cover 14 is in the sensed area A at the same time (that is, the second opened state).

The implementations of the description "the multi-stage sensor 18" are provided in the following embodiments, but the instant disclosure is not limited thereto.

In some embodiments, the multi-stage sensor 18 corresponds to the sensed area A. For example, in FIG. 2A, the base 12 comprises a second fixing element 128, and two sides of the second fixing element 128 are detachably connected to the base 12 (for example, the second side wall 124 shown in FIG. 2A) and the multi-stage sensor 18, respectively, in a manner of such as bolting, locking, snapping, and so on. In this way, through the second fixing element 128, the multi-stage sensor 18 can be detachably fixed between the side-sensed element 166 and the base 12, so that the sensed quantities (which will be described later) provided by the top-sensed element 142 and the side-sensed element 166 in the sensed area A can be sensed and learned by the multi-stage sensor 18.

Figure 3C:
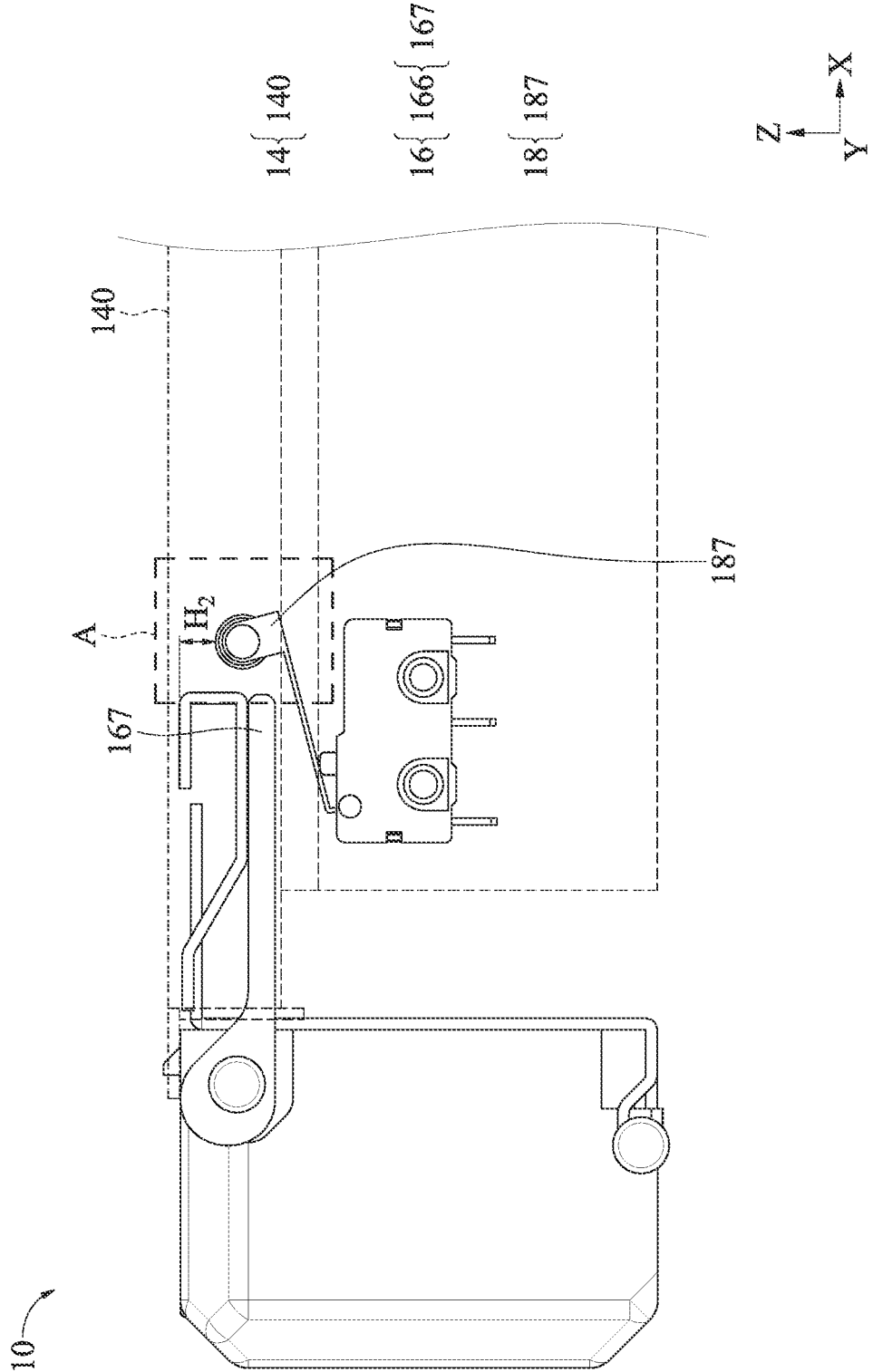
FIG. 3C illustrates a side perspective view of an electronic device according to some embodiments, wherein the electronic device is in a second opened state.

Please refer to FIG. 3A to FIG. 3C. FIG. 3B and FIG. 3C respectively illustrate side perspective views of electronic devices 10 according to some embodiments, wherein the electronic devices 10 are respectively in a first opened state and a second opened state. Each of the electronic devices 10 shown in FIG. 3A to FIG. 3C is an electronic device 10 having two-stage opened states, where the electronic devices 10 shown in FIG. 3A to FIG. 3C are in "an unopened state" (that is, the state that both the top cover 14 and the side cover 16 are unopened), "a first opened state" (that is, the state that only the side cover 16 is opened), and "a second opened state" (that is, the state that both the top cover 14 and the side cover 16 are opened), respectively.

In some embodiments, the multi-stage sensor 18 comprises a sensing arm 187 extending from the multi-stage sensor 18 into the sensed area A. In FIG. 3B, in response to that only the top-sensed element 142 is in the sensed area A, the sensing arm 187 has a first sensed quantity. In FIG. 3C, in response to that neither the top-sensed element 142 nor the side-sensed element 167 is in the sensed area A, the sensing arm 187 has a second sensed quantity. The first sensed quantity is substantially different from the second sensed quantity. In response to that the sensing arm 187 has the first sensed quantity, the multi-stage sensor 18 outputs a first signal; and in response to that the sensing arm 187 has the second sensed quantity, the multi-stage sensor 18 outputs a second signal. For example, in the first opened state shown in FIG. 3B, the sensing arm 187 has a first sensed quantity being the first height $H_1$ (that is, the height of the top-sensed element 142); and in the second opened state shown in FIG. 3C, the sensing arm 187 has a second sensed quantity being the second height $H_2$. The second height $H_2$ is less than the first height $H_1$ (that is, the second height $H_2$ is substantially different from the first height $H_1$). In this way, through the multi-stage sensor 18 that senses the first sensed quantity and the second sensed quantity of the sensing arm 187, the electronic device 10 according to some embodiments can respectively sense and obtain the two-stage opened state of the top cover 14 and the side cover 16.

Figure 5:
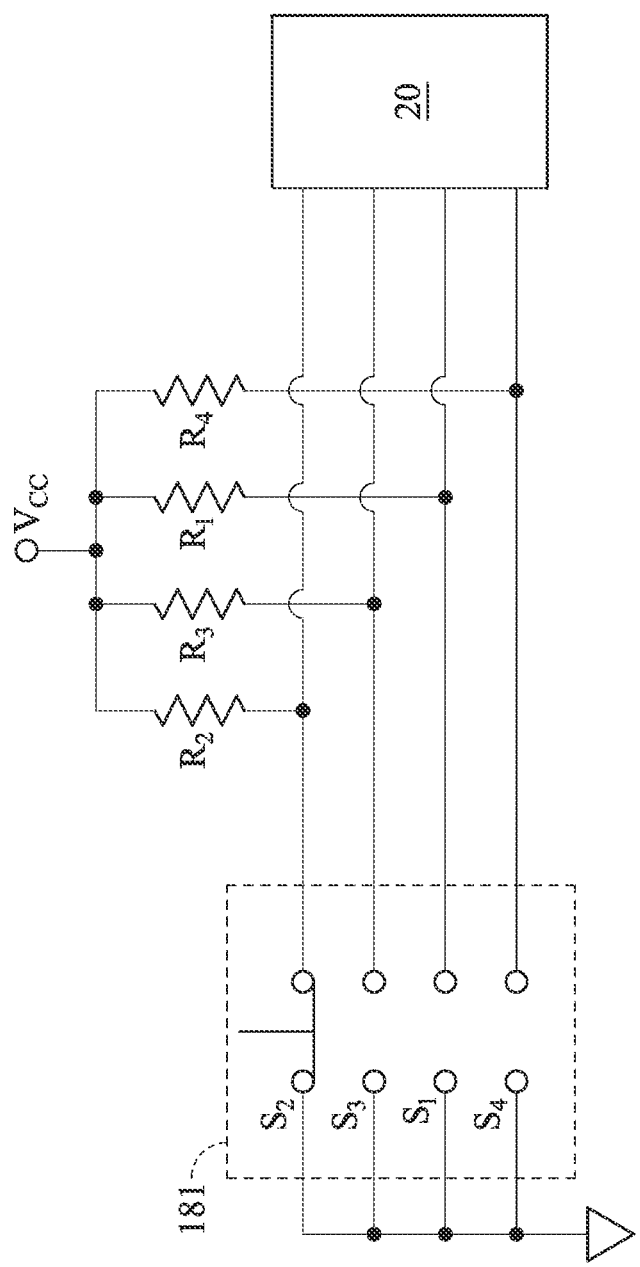
FIG. 5 illustrates a schematic view of a multi-stage sensor of an electronic device according to some embodiments.

Please refer to FIG. 3B, FIG. 3C, and FIG. 5. FIG. 5 illustrates a schematic view of a multi-stage sensor 18 of an electronic device 10 according to some embodiments. In some embodiments, the multi-stage sensor 18 is a multi-stage sensing element; for example, the multi-stage sensing element is a multi-stage switch 181 on a sensor mount 180. In some embodiments, the multi-stage switch 181 comprises a first stage switch $S_1$ and a second stage switch $S_2$. In response to that the sensing arm 187 senses the first sensed quantity, the first stage switch $S_1$ is electrically conducted; and in response to that the sensing arm 187 senses the second sensed quantity, the second stage switch $S_2$ is electrically conducted. For example, in FIG. 5, since the sensing arm 187 has the first height $H_1$ in the first opened state (shown in FIG. 3B) and has the second height $H_2$ in the second opened state (shown in FIG. 3C), the first stage switch $S_1$ and the second stage switch $S_2$ of the multi-stage switch 181 are then electrically conducted, respectively. In some embodiments, the electronic device 10 comprises a controlling unit 20 (shown in FIG. 5), and the multi-stage sensor 18 is adapted to be in communication with the controlling unit 20. In FIG. 5, the controlling unit 20 is electrically conducted to the first stage switch $S_1$ and the second stage switch $S_2$ (and/or a third stage switch $S_3$ and a fourth stage switch $S_4$, which will be described later). For example, in response to that the first stage switch $S_1$ is electrically conducted, the signal of the first stage switch $S_1$ (which may be referred to as the first signal) sensed by the controlling unit 20 is ground, and the signals of the rest of the switches (such as the second stage switch $S_2$, the third stage switch $S_3$, and the fourth stage switch $S_4$, and the signals of these switches may be referred to as the second signal, the third signal, and the fourth signal, respectively) sensed by the controlling unit 20 are at high voltage levels (denoted as $V_{CC}$ in FIG. 5). Similarly, in response to the second stage switch $S_2$ is electrically conducted, the signal of the second stage switch $S_2$ sensed by the controlling unit 20 is ground, and the signals of the rest of the switches (such as the first stage switch $S_1$, the third stage switch $S_3$, and the fourth stage switch $S_4$, and the signals of these switches may be referred to as the first signal, the third signal, and the fourth signal, respectively) sensed by the controlling unit 20 are at high voltage levels (denoted as $V_{CC}$ in FIG. 5). In this way, the controlling unit 20 according to some embodiments can respectively sense and obtain the multi-stage opened state of the side cover 16 and the top cover 14.

The controlling unit 20 may continuously sense the state of each switch in the multi-stage switch 181 to obtain the first signal and the second signal, respectively (even to obtain the third signal and the fourth signal, which will be described later). The controlling unit 20 may also intermittently sense the state of each switch in the multi-stage switch 181. The controlling unit 20 is configured to receive the signals output by the multi-stage sensor 18 to give the multi-stage sensor 18 and/or the covers further corresponding treatment according to the signals. The controlling unit 20 may be a baseboard management controller (BMC), a complex programmable logic device (CPLD), or a combination thereof. In some embodiments, the electronic device 10 is adapted to load other contents 30 (shown in FIG. 1B), and the controlling unit 20 is in communication with at least one of the contents 30 to transmit one or more command signals back to the at least one of the contents 30 according to the signals. The command signals may be adapted to, for example, but not limited to, generate the corresponding log, lock or format the contents 30, or even request the contents 30 to issue an alarm, which are not particularly limited herein.

In some embodiments, for example, in FIG. 3A or FIG. 4A, in response to that both the top-sensed element 142 and the side-sensed element 166 are in the sensed area A, the sensing arm 187 has a fourth sensed quantity, and the fourth sensed quantity is substantially different from the first sensed quantity and the second sensed quantity. In the unopened state of FIG. 3A, the fourth quantity is the fourth height $H_4$ (that is, as mentioned above, in the unopened state, the distance between the top cover body 140 and the surface of the extending portion 167 near the base 12); likewise, in the unopened state of FIG. 4A, the fourth quantity is the fourth height $H_{4'}$. In other words, the fourth height $H_4$ is the sum of the first height $H_1$ (the height of the top-sensed element 142 itself or the height of the end portion of the top-sensed element 142) and the thickness $H_0$ of the side-sensed element 166, and the fourth height $H_{4'}$ is the sum of the first height $H_1$ and the thickness $H_{0'}$ of the side-sensed element 166. Hence, the multi-stage sensor 18 can continuously or intermittently receive the fourth sensed quantities (such as the fourth resistances $R_4$ shown in FIG. 5) corresponding to the unopened state shown in FIG. 3A or FIG. 4A to output the fourth signals. In this way, the controlling unit 20 can receive the fourth signals that are set to be continuously or intermittently transmitted back at a specific time. By configuring the multi-stage sensor 18 and/or the controlling unit 20 to receive these fourth signals continuously or intermittently, not only whether the electronic device 10 is in the unopened state or not can be learned, but also whether the sensing arm 187 and/or the multi-stage sensor 18 are in a normal state can be further determined, so that the states of the top cover 14 and the side cover 16 can be sensed normally.

Figure 6:
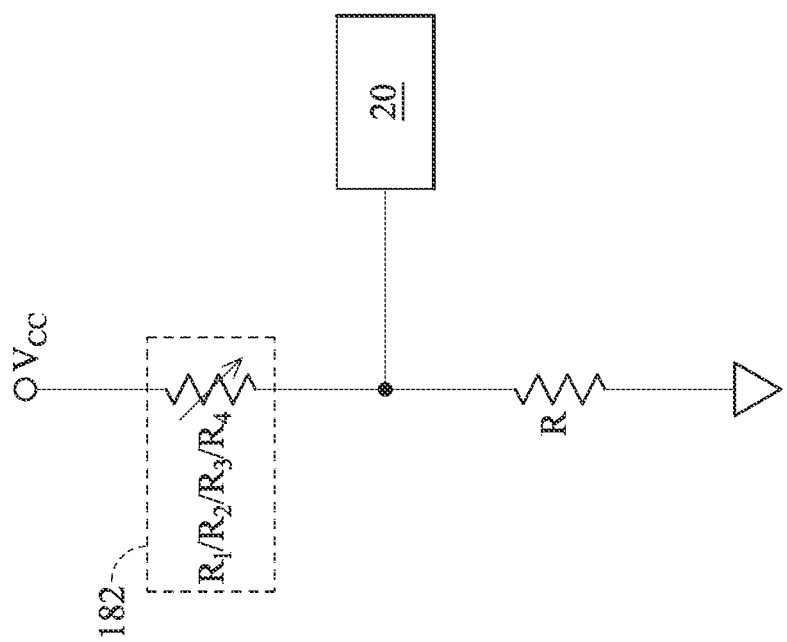
FIG. 6 illustrates a schematic view of a multi-stage sensor of an electronic device according to some embodiments.

Please refer to FIG. 3B, FIG. 3C, and FIG. 6. FIG. 6 illustrates a schematic view of a multi-stage sensor 18 of an electronic device 10 according to some embodiments. In some embodiments, the multi-stage sensor 18 is a resistance-type sensing element; for example, the resistance-type sensing element is a variable resistance sensor 182 (it is noted that, the multi-stage sensors 18 in FIG. 3A to FIG. 3C are only shown and exemplified with the multi-stage switches 181, but the multi-stage switches 181 can also be replaced by the variable resistance sensors 182 described herein, which are thus not additionally illustrated in the figures). The variable resistance sensor 182 outputs the first signal and the second signal according to the first sensed quantity and the second sensed quantity of the sensing arm 187. For example, in FIG. 6, since the sensing arm 187 has the first height $H_1$ in the first opened state (shown in FIG. 3B) and the second height $H_2$ in the second opened state (shown in FIG. 3C), the variable resistance sensor 182 has a first resistance $R_1$ and a second resistance $R_2$ corresponding to the first height $H_1$ and the second height $H_2$, respectively. The controlling unit 20 senses a divided voltage of the first resistance $R_1$ (or a second resistance $R_2$) and a divided voltage of a fixed resistance R to learn whether the sensing arm 187 is in the first opened state or the second opened state. In this way, through the variable resistance sensor 182 of the multi-stage sensor 18 that senses the resistances in the different multi-stage opened states, the electronic device 10 according to some embodiments can respectively sense the two-stage opened state of the top cover 14 and the side cover 16.

Figure 7A:
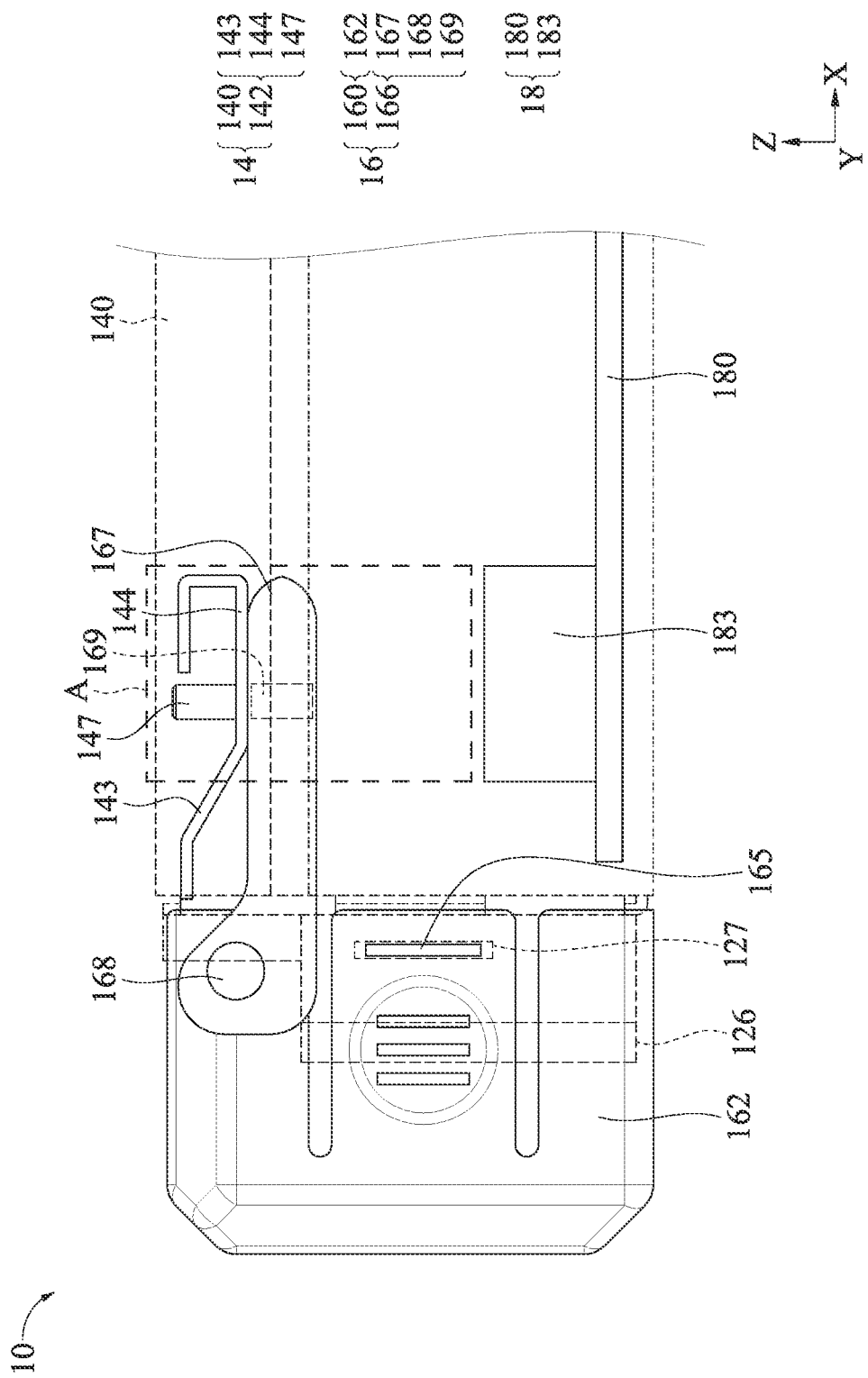
FIG. 7A illustrates a side perspective view of an electronic device according to some embodiments, wherein the electronic device is in an unopened state.
Figure 7B:
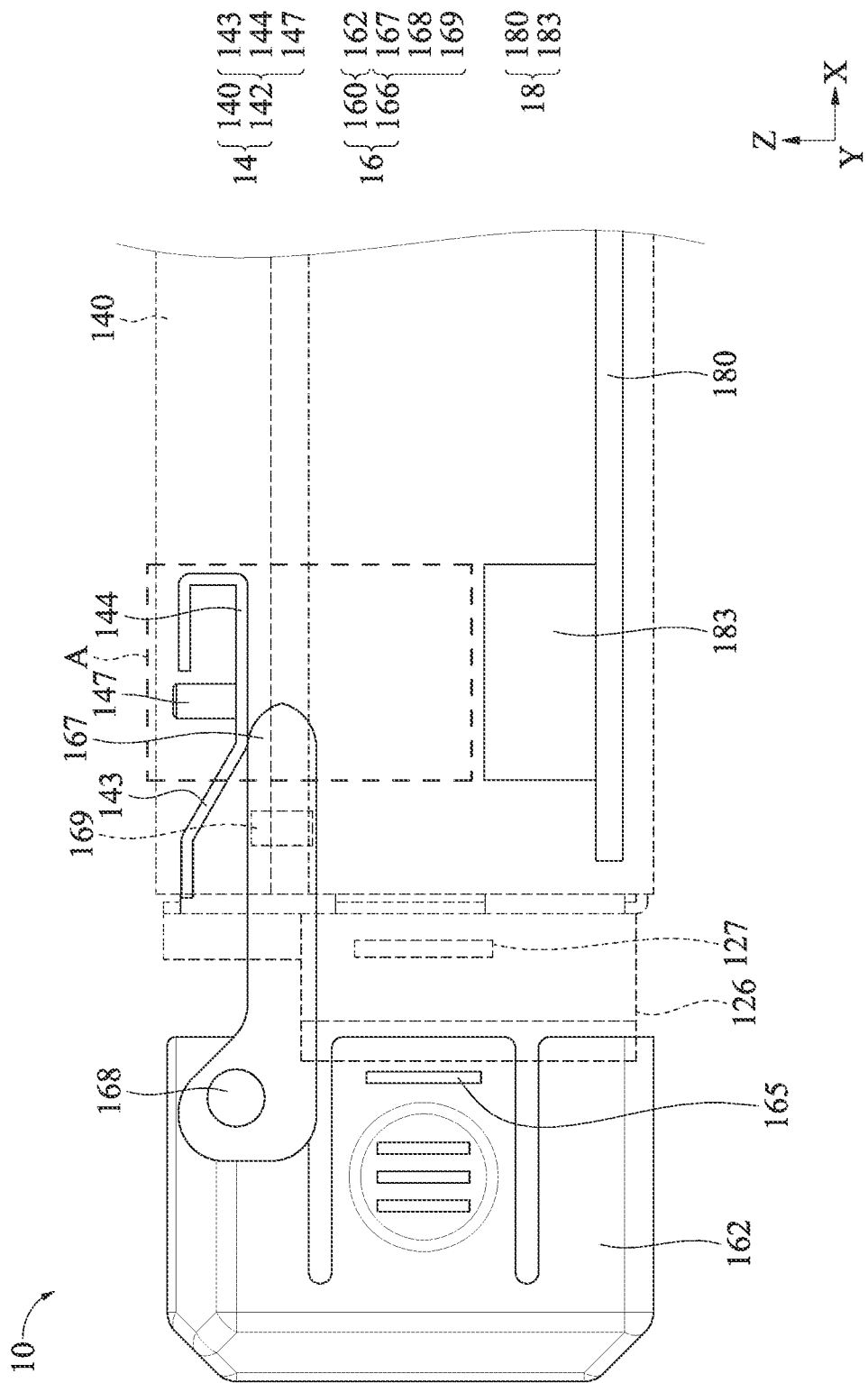
FIG. 7B illustrates a side perspective view of an electronic device according to some embodiments, wherein the electronic device is in a first opened state.
Figure 7C:
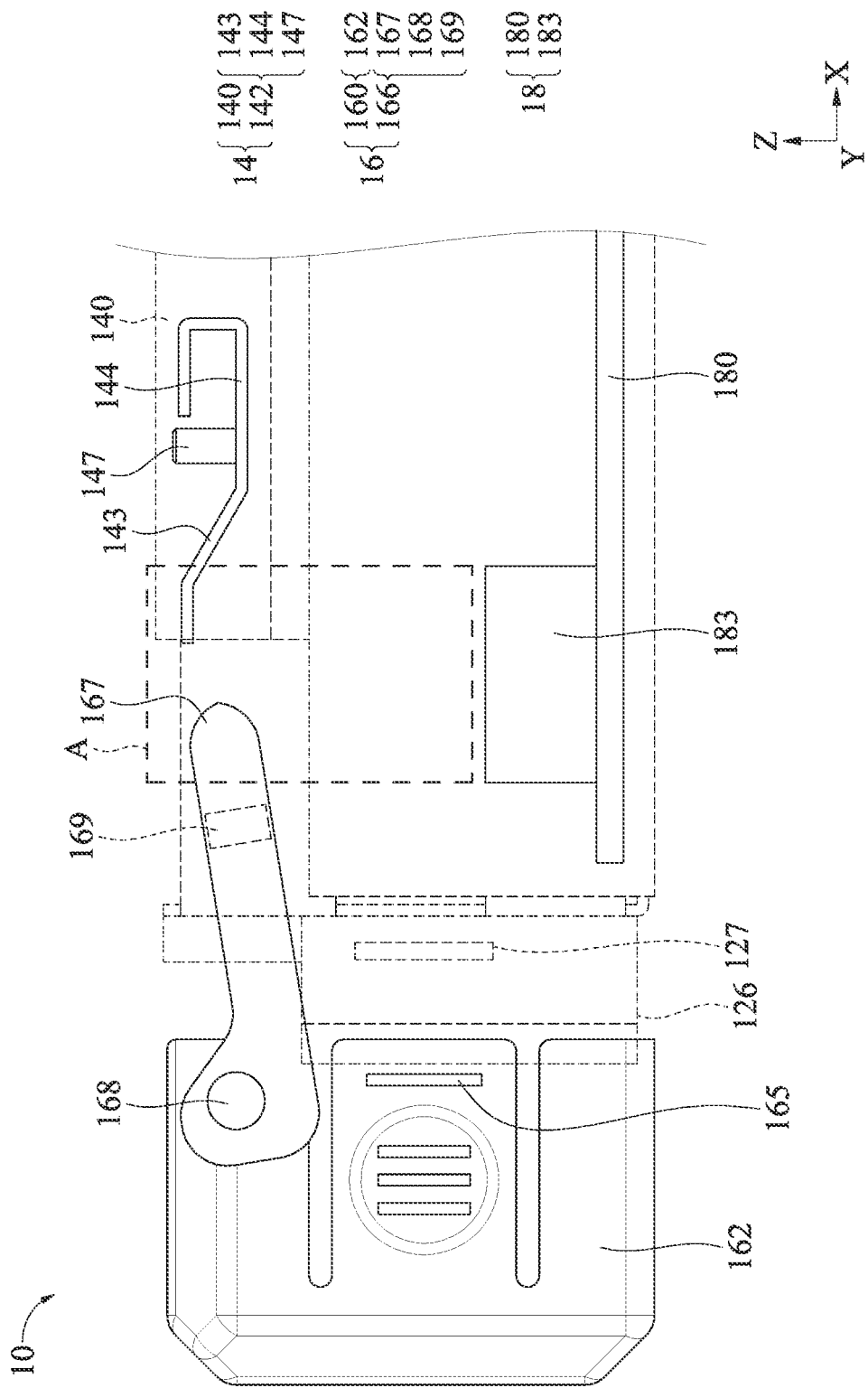
FIG. 7C illustrates a side perspective view of an electronic device according to some embodiments, wherein the electronic device is in a second opened state.

Please refer to FIG. 7A to FIG. 7D. FIG. 7A to FIG. 7D respectively illustrate side perspective views of electronic devices 10 according to some embodiments, wherein the electronic devices 10 are respectively in an unopened state, a first opened state, a second opened state, and a third opened state. In some embodiments, the multi-stage sensor 18 is a magnetic-induction-type sensing element, the electronic device 10 comprises a sensor mount 180, and the magnetic-induction-type sensing element is fixed to the sensor mount 180. The sensor mount 180 may be a rigid bottom plate or a tank body detachably connected to the base 12 (for example, the side wall of the base 12 or the bottom plate 120). Alternatively, in some embodiments, the sensor mount 180 may be a circuit board. In FIG. 7A, the magnetic-induction-type sensing element is a Hall sensor 183 fixed to the sensor mount 180. The top-sensed element 142 comprises a top magnet 147. The top magnet 187 may be, for example, on the top cover body 140 (for example, a side of the top cover body 140 that is near the base 12), between the top cover body 140 and the top-sensed element 142, or inside the top-sensed element 142. The side-sensed element 166 comprises a side magnet 169. The side magnet 169 may be, for example, between the extending portion 167 of the side-sensed element 166 and the top cover body 140 (or the top-sensed element 142), or inside the extending portion 167. The top magnet 147 and the side magnet 169 have magnetic fluxes, respectively, and the magnetic flux of the top magnet 147 may be substantially the same as or different from the magnetic flux of the side magnet 169, which is not particularly limited herein. The Hall sensor 183 outputs a first signal and a second signal corresponding to the magnetic fluxes of the top magnet 147 and the side magnet 169. For example, in the first opened state shown in FIG. 7B, in response to that only the top-sensed element 142 (comprising the top magnet 147) is in the sensed area A (that is, only the top magnet 147 is in the sensed area A), the Hall sensor 183 outputs the first signal correspondingly according to the magnetic flux of the top magnet 147 (that is, the first sensed quantity). In the second opened state shown in FIG. 7C, in response to that neither the top-sensed element 142 nor the side-sensed element 166 is in the sensed area A (that is, neither the top magnet 147 nor the side magnet 169 is in the sensed area A), the Hall sensor 183 outputs the second signal correspondingly according to the magnetic flux of the side magnet 169; for example, the second signal may be null (that is, the second sensed quantity). In this way, through the magnetic fluxes sensed by the multi-stage sensor 18 (that is, in this embodiment, the Hall sensor 183) in the different multi-stage opened states, the electronic device 10 according to some embodiments can respectively sense the two-stage opened state of the top cover 14 and the side cover 16.

Figure 7D:
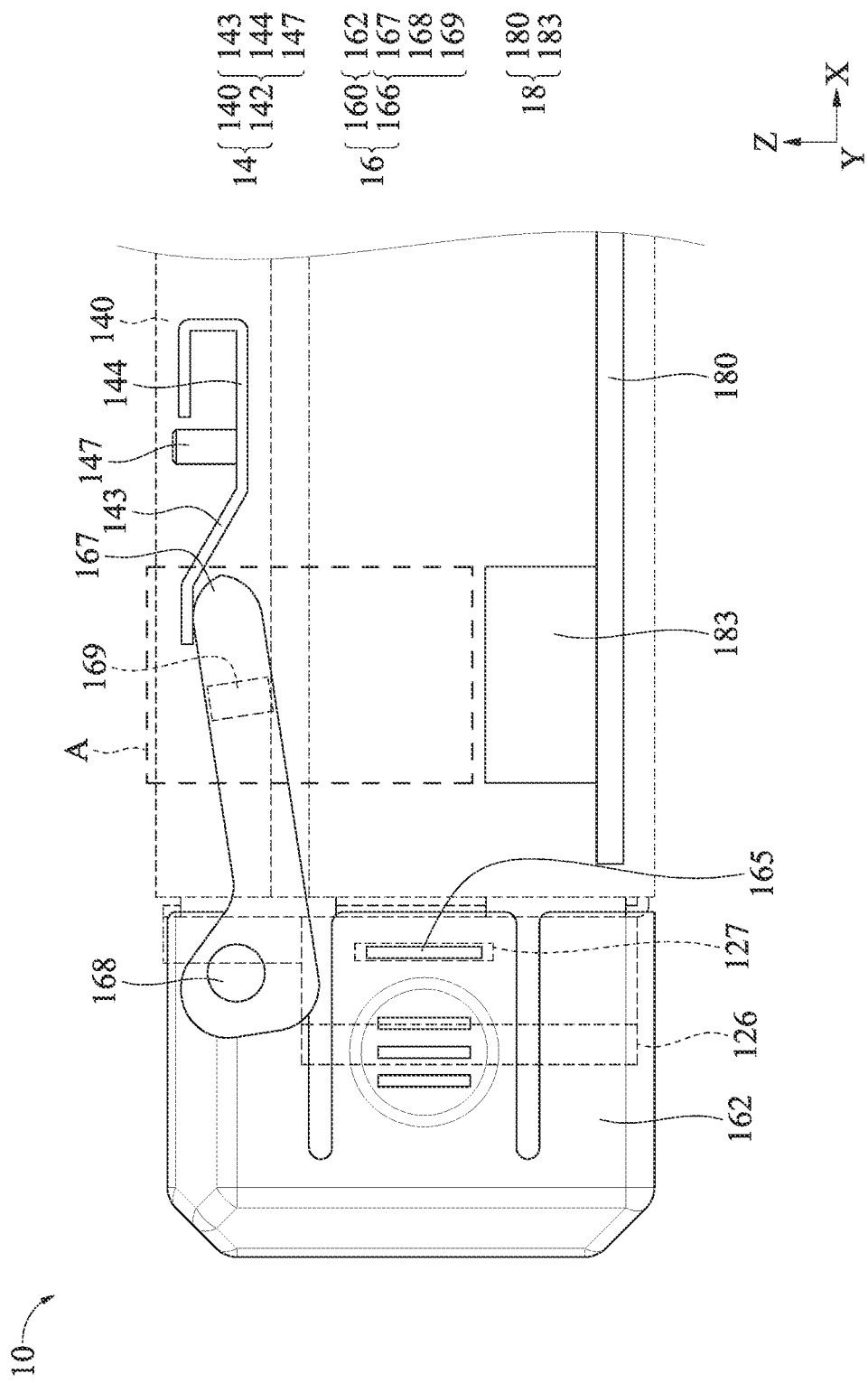
FIG. 7D illustrates a side perspective view of an electronic device according to some embodiments, wherein the electronic device is in a third opened state.

Further, according to some embodiments, in the third opened state shown in FIG. 7D, in response to that only the side-sensed element 166 (comprising the side magnet 169) is in the sensed area A, the Hall sensor 183 further outputs a third signal according to the magnetic flux of the side magnet 169 (that is, the third sensed quantity). In this way, through the multi-stage sensor 18 (that is, the Hall sensor 183) that senses the magnetic fluxes in the different opened states, the electronic device 10 according to some embodiments can respectively sense the three-stage opened state of the top cover 14 and the side cover 16.

Moreover, according to some embodiments, as mentioned above, for example, in the unopened state shown in FIG. 7A, in response to that both the top-sensed element 142 and the side-sensed element 166 are in the sensed area A, the Hall sensor 183 may further output a fourth signal corresponding to the sum of the magnetic fluxes of the top magnet 147 and the side magnet 169 (that is, the fourth sensed quantity). By configuring the multi-stage sensor 18 to receive these fourth signals continuously or intermittently, not only whether the electronic device 10 is in the unopened state or not can be learned, but also whether the multi-stage sensor 18 is in a normal state can be further determined, so that the states of the top cover 14 and the side cover 16 can be sensed normally.

Figure 8A:
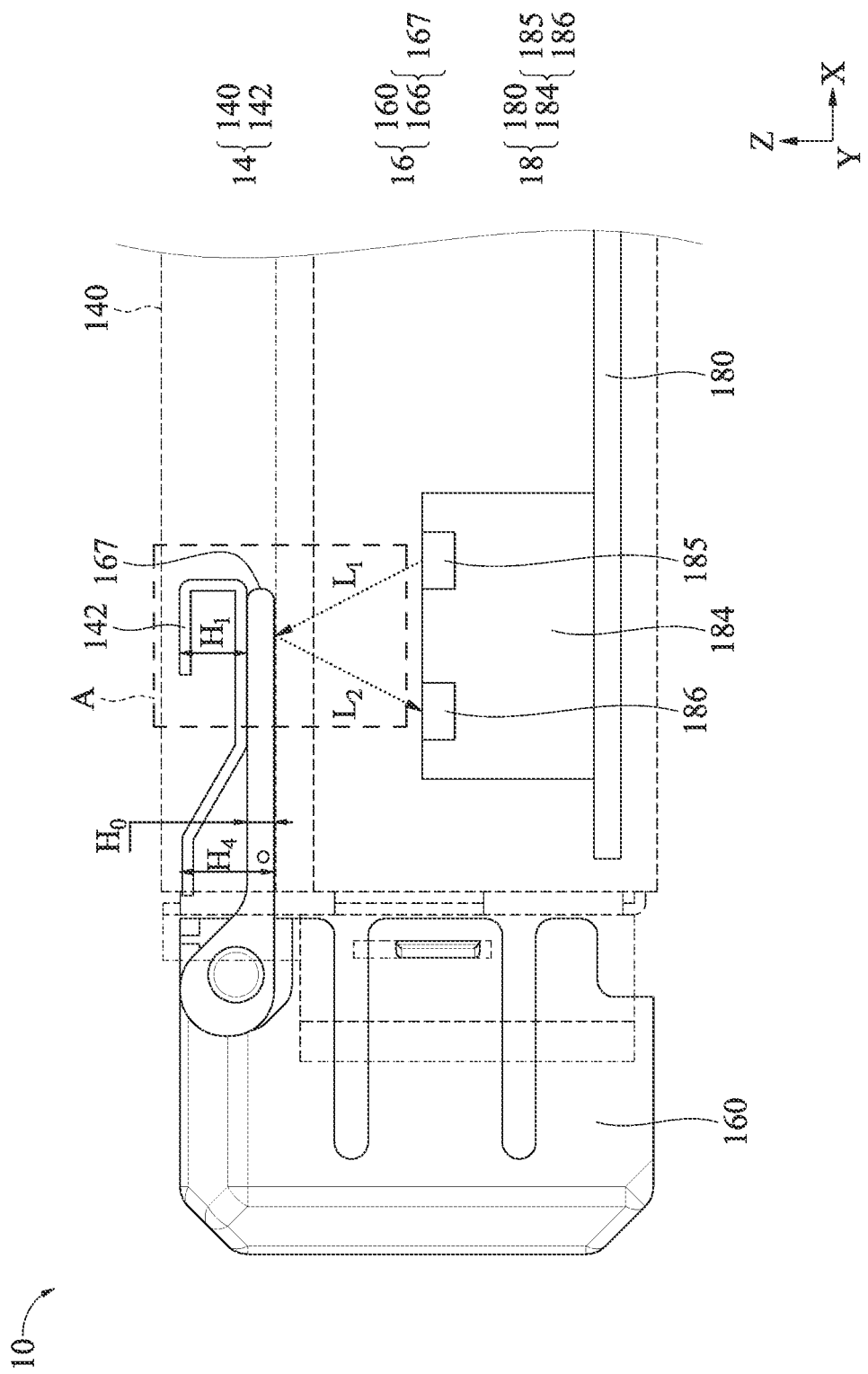
FIG. 8A illustrates a side perspective view of an electronic device according to some embodiments, wherein the electronic device is in an unopened state.
Figure 8B:
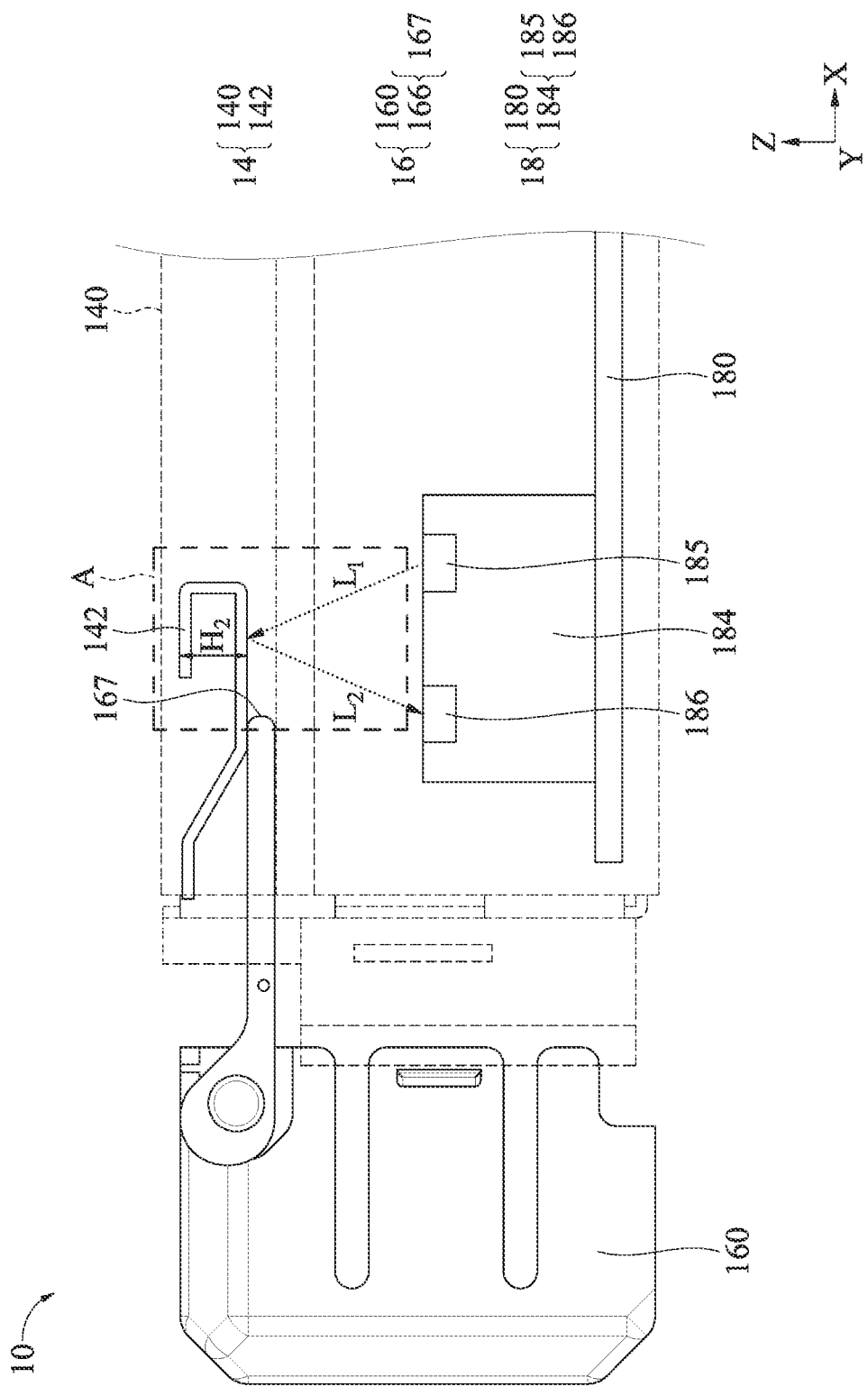
FIG. 8B illustrates a side perspective view of an electronic device according to some embodiments, wherein the electronic device is in a first opened state.
Figure 8C:
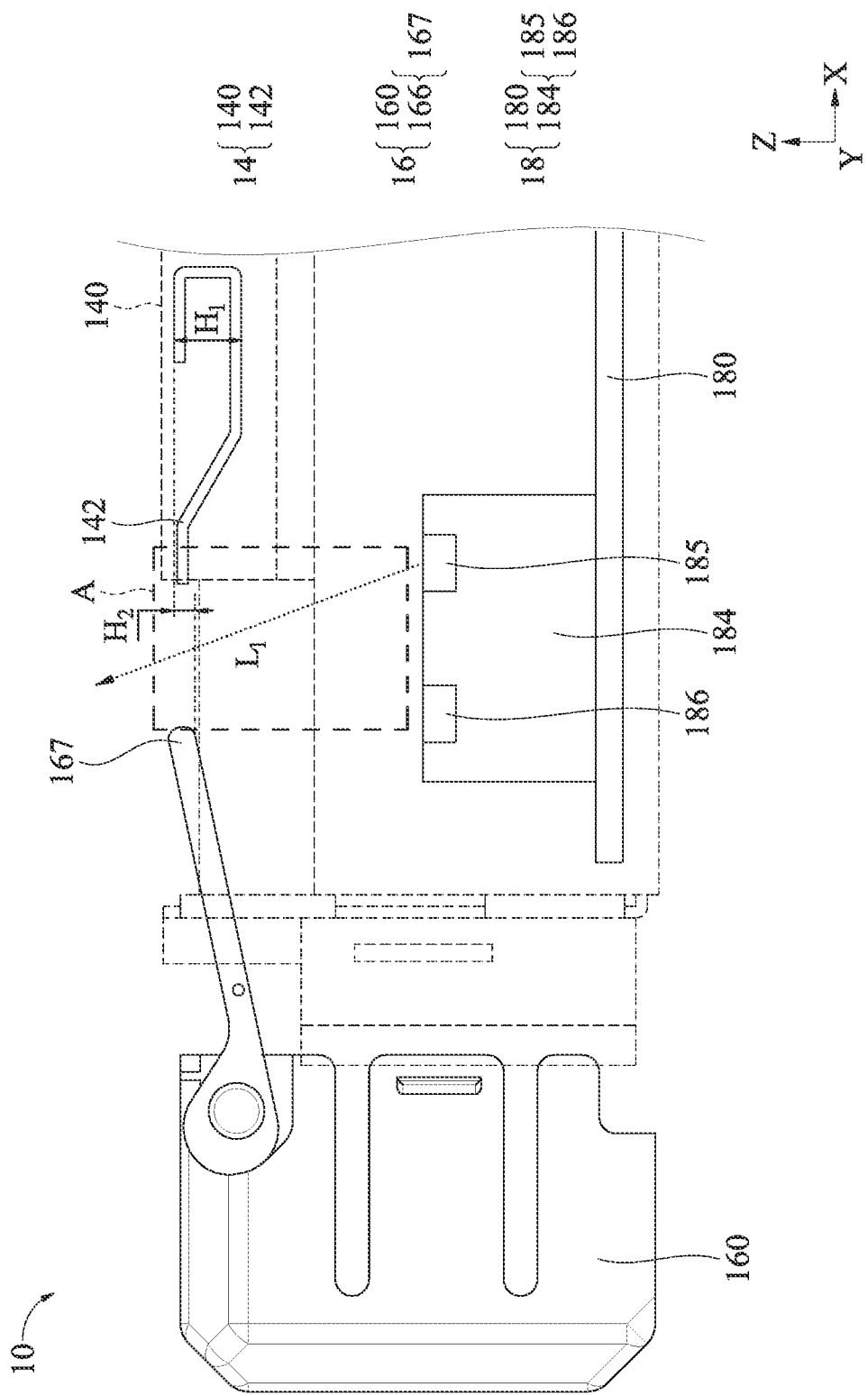
FIG. 8C illustrates a side perspective view of an electronic device according to some embodiments, wherein the electronic device is in a second opened state.

Please refer to FIG. 8A to FIG. 8C. FIG. 8A to FIG. 8C respectively illustrate side perspective views of electronic devices 10 according to some embodiments, wherein the electronic devices 10 are in an unopened state, a first opened state, and a second opened state. Each of the electronic devices 10 shown in FIG. 8A to FIG. 8C is an electronic device 10 having at-least-two-stage opened states, where the electronic devices 10 shown in FIG. 8A to FIG. 8C are in "an unopened state" (that is, the state that both the top cover 14 and the side cover 16 are unopened), "a first opened state" (that is, the state that only the side cover 16 is opened), and "a second opened state" (that is, the state that both the top cover 14 and the side cover 16 are opened), respectively. In some embodiments, the multi-stage sensor 18 is a light-sensing-type sensing element, the electronic device 10 comprises a sensor mount 180, and the light-sensing-type sensing element is fixed to the sensor mount 180. The sensor mount 180 may be a rigid bottom plate or a tank body detachably connected to the base 12 (for example, the side wall of the base 12 or the bottom plate 120). Alternatively, in some embodiments, the sensor mount 180 may be a circuit board. The light-sensing-type sensing element may be a light sensor 184; for example, the light sensor 184 may be a light distance sensor or a light color sensor.

According to some embodiments, in FIG. 8A to FIG. 8C, the light sensor 184 may be, for example, a light distance sensor emitting an emitted light $L_1$ along a direction toward the top cover 14. The emitted light $L_1$ may be a monochromatic light, a polychromatic light, or a white light. In the first opened state shown in FIG. 8B, in response to that only the top-sensed element 142 is in the sensed area A, the light distance sensor outputs a first signal corresponding to a round-trip distance of the emitted light $L_1$ reflected from the top-sensed element 142 (that is, the path denoted by $L_1+L_2$); in the second opened state shown in FIG. 8C, in response to that neither the top-sensed element 142 nor the side-sensed element 166 is in the sensed area A, the emitted light $L_1$ emitted by the light distance sensor may pass through the top cover 14 (which is not reflected back to the light distance sensor), and the light distance sensor outputs a second signal correspondingly at this moment.

Specifically, according to some embodiments, in the first opened state shown in FIG. 8B, the light distance sensor comprises a light-emitting portion 185 and a light-receiving portion 186. The light-emitting portion 185 and the light-receiving portion 186 are adjacent to each other and disposed on a side of the light distance sensor near the top cover 14. The light-emitting portion 185 of the light distance sensor emits an emitted light $L_1$ toward the surface of the top-sensed element 142, where a first acute angle is formed between the emitted light $L_1$ and a normal line of the surface of the light distance sensor. Subsequently, the light-receiving portion 186 of the light distance sensor receives a reflected light $L_2$. The light distance sensor calculates the distance between the light distance sensor and the top-sensed element 142 (that is, the first sensed quantity) according to the time difference between the emitting time of the emitted light $L_1$ and the receiving time of the reflected light $L_2$, and the light distance sensor outputs the first signal correspondingly. In the second opened state shown in FIG. 8C, an emitted light $L_1$ is emitted from the light distance sensor, where a second acute angle is formed between the emitted light $L_1$ and a normal line of the surface of the light distance sensor. The second acute angle may be substantially the same as or different from the first acute angle. However, in the second opened state shown in FIG. 8C, since neither the top-sensed element 142 nor the side-sensed element 166 is in the sensed area A, there is no reflected light. The light distance sensor fails to receive the reflected light and thus outputs the second signal correspondingly; for example, the second signal may be null (that is, the second sensed quantity). In this way, through such as the reflecting time/the reflecting distance of the emitted light $L_1$ sensed by the multi-stage sensor 18 (that is, in this embodiment, the light distance sensor) in the different opened states, the electronic device 10 according to some embodiments can respectively sense the two-stage opened state of the top cover 14 and the side cover 16.

Figure 8D:
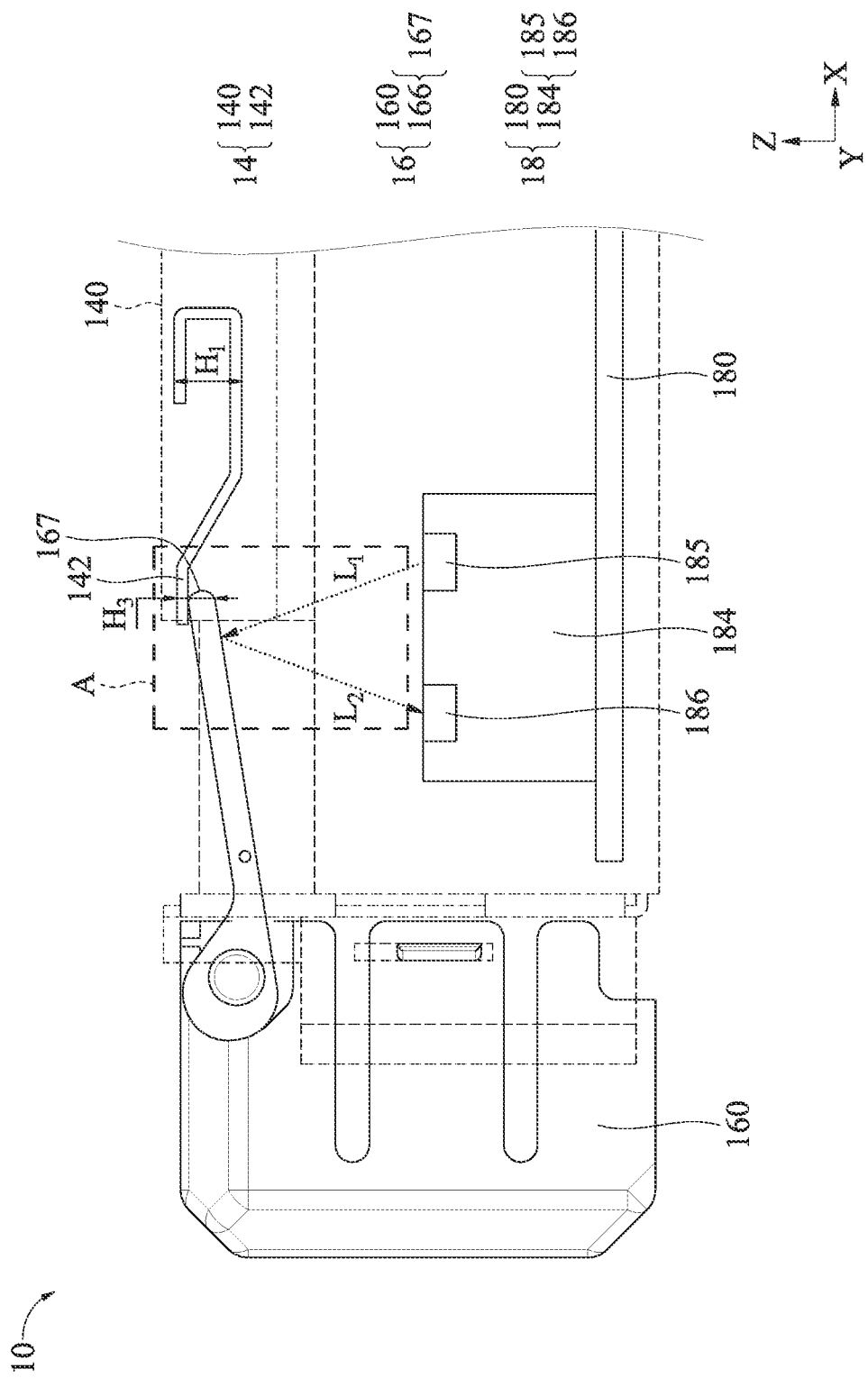
FIG. 8D illustrates a side perspective view of an electronic device according to some embodiments, wherein the electronic device is in a third opened state.

Please refer to FIG. 8D. FIG. 8D illustrates a side perspective view of an electronic device 10 according to some embodiments, wherein the electronic device 10 is in a third opened state. Each of the electronic devices 10 shown in FIG. 8A to FIG. 8D is an electronic device 10 having three-stage opened states, where the electronic device 10 shown in FIG. 8D is in "a third opened state" (that is, the state that only the top cover 14 is opened). According to some embodiments, in response to that only the side-sensed element 166 is in the sensed area A, the light distance sensor further outputs a third signal according to a distance from the emitted light $L_1$ to the side-sensed element 166. For example, in the third opened state shown in FIG. 8D, the torsion force of the torsion spring 164 (shown in FIG. 2B) normally forces the side-sensed element 166 to be pivotally rotated along the counterclockwise direction shown in FIG. 8D; meanwhile, the distance between the surface of the side-sensed element 166 near the base 12 and the top cover body 140 is a third height $H_3$. The third height $H_3$ is less than the first height $H_1$ (that is, the distance between the top-sensed element 142 and the top cover body 140); in other words, in this embodiment, the third height $H_3$ is substantially different from the first height $H_1$. For example, through the engagement between the torsion spring 164 (shown in FIG. 2B; or the second shafting element 168 (also shown in FIG. 2B)) and the side cover body 160, the side-sensed element 166 having the third height $H_3$ is restricted in the sensed area A and within a space between the top and the bottom of the first height $H_1$. Accordingly, the light-emitting portion 185 of the light distance sensor emits the emitted light $L_1$ toward the surface of the top-sensed element 142, and the emitted light $L_1$ is reflected by the surface of the top-sensed element 142 to generate a reflected light $L_2$ toward a side of the base 12. Subsequently, the light-receiving portion 186 of the light distance sensor receives the reflected light $L_2$. The light distance sensor calculates the distance between the light distance sensor and the side-sensed element 166 (that is, the third sensed quantity) according to the time difference between the emitting time of the emitted light $L_1$ and the receiving time of the reflected light $L_2$, and the light distance sensor outputs the third signal correspondingly. In this way, through such as the reflecting time/the reflecting distance of the emitted light $L_1$ sensed by the multi-stage sensor 18 (that is, in this embodiment, the light distance sensor) in the different opened states, the electronic device 10 according to some embodiments can respectively sense the three-stage opened state of the top cover 14 and the side cover 16.

Moreover, according to some embodiments, as mentioned above, for example, in FIG. 8A, both the top-sensed element 142 and the side-sensed element 166 are in the sensed area A, the light distance sensor may further output a fourth signal corresponding to the distance from the emitted light $L_1$ to the side-sensed element 166. For example, in the unopened state shown in FIG. 8A, an emitted light $L_1$ is emitted from the light distance sensor toward the surface of the side-sensed element 166 and reflected by the surface of the side-sensed element 166 to generate a reflected light $L_2$ toward a side of the base 12. The light distance sensor subsequently receives the reflected light $L_2$ to calculate the distance between the light distance sensor and the side-sensed element 166 (that is, the fourth sensed quantity) according to the time difference between the emitting time of the emitted light $L_1$ and the receiving time of the reflected light $L_2$, and the light distance sensor outputs the fourth signal correspondingly. By configuring the multi-stage sensor 18 (that is, in this embodiment, the light distance sensor) to receive these fourth signals continuously or intermittently, not only whether the electronic device 10 is in the unopened state or not can be learned, but also whether the multi-stage sensor 18 is in a normal state can be further determined, so that the states of the top cover 14 and the side cover 16 can be sensed normally.

According to some embodiments, in FIG. 8A to FIG. 8C, the light sensor 184 may be, for example, a light color sensor. The top-sensed element 142 has a top element color, the side-sensed element 166 has a side element color, and the top element color is substantially different from the side element color. The light color sensor emits an emitted light $L_1$ along a direction toward the top cover 14. The emitted light $L_1$ may be a monochromatic light, a polychromatic light, or a white light. In response to that only the top-sensed element 142 is in the sensed area A, the light color sensor receives the reflected light $L_2$ to output the first signal according to the color of the reflected light $L_2$; on the other hand, in response to that neither the top-sensed element 142 nor the side-sensed element 166 is in the sensed area A, the light color sensor outputs a second signal. For example, in the first opened state shown in FIG. 8B, the light color sensor comprises a light-emitting portion 185 and a light-receiving portion 186. The light-emitting portion 185 and the light-receiving portion 186 are adjacent to each other and disposed on a side of the light color sensor near the top cover 14. The light-emitting portion 185 of the light color sensor emits the emitted light $L_1$ toward the surface of the top-sensed element 142, where a first acute angle is formed between the emitted light $L_1$ and a normal line of the surface of the light distance sensor. The emitted light $L_1$ may be a light having a color same as the top element color (for example, a monochromatic light), or a light having a color at least comprising the top element color (for example, a polychromatic light or a white light). The light having the top element color in the emitted light $L_1$ (that is, the reflected light $L_2$) can be reflected by the surface of the top-sensed element 142. Subsequently, the light-receiving portion 186 of the light color sensor receives the reflected light $L_2$. According to the color of the reflected light $L_2$ (that is, the first sensed quantity), the light color sensor learns whether the reflected light $L_2$ is reflected from the top-sensed element 142 or not, and the light color sensor outputs the first signal correspondingly. In the second opened state shown in FIG. 8C, since neither the top-sensed element 142 nor the side-sensed element 166 is in the sensed area A, there is no reflected light. The light color sensor fails to receive the reflected light and thus outputs the second signal correspondingly; for example, the second signal may be null (that is, the second sensed quantity). In this way, through such as the color of the reflected light $L_2$ sensed by the multi-stage sensor 18 (that is, in this embodiment, the light color sensor) in the different opened states, the electronic device 10 according to some embodiments can respectively sense the two-stage opened state of the top cover 14 and the side cover 16.

According to some embodiments, in the third opened state shown in FIG. 8D (that is, the state that only the top cover 14 is opened), in response to that only the side-sensed element 166 is in the sensed area A, the light color sensor further emits an emitted light $L_1$ along a direction toward the top cover 14. The emitted light $L_1$ may be a light having a color same as the side element color (for example, a monochromatic light), or a light having a color at least comprising the side element color (for example, a polychromatic light or a white light). Subsequently, the light color sensor receives a reflected light $L_2$ to output a third signal according to the color of the reflected light $L_2$. In the third opened state shown in FIG. 8D, the light-emitting portion 185 of the light color sensor emits the emitted light $L_1$ toward the surface of the side-sensed element 166, and the light having the side element color in the emitted light $L_1$ (that is, the reflected light $L_2$) can be reflected by the surface of the side-sensed element 166. Subsequently, according to the color of the reflected light $L_2$ (that is, the third sensed quantity), the light color sensor learns whether the reflected light $L_2$ is reflected from the side-sensed element 166 or not, and the light color sensor outputs the third signal correspondingly. In this way, through such as the color of the reflected light $L_2$ sensed by the multi-stage sensor 18 (that is, in this embodiment, the light color sensor) in the different opened states, the electronic device 10 according to some embodiments can respectively sense the three-stage opened state of the top cover 14 and the side cover 16.

Figure 4B:
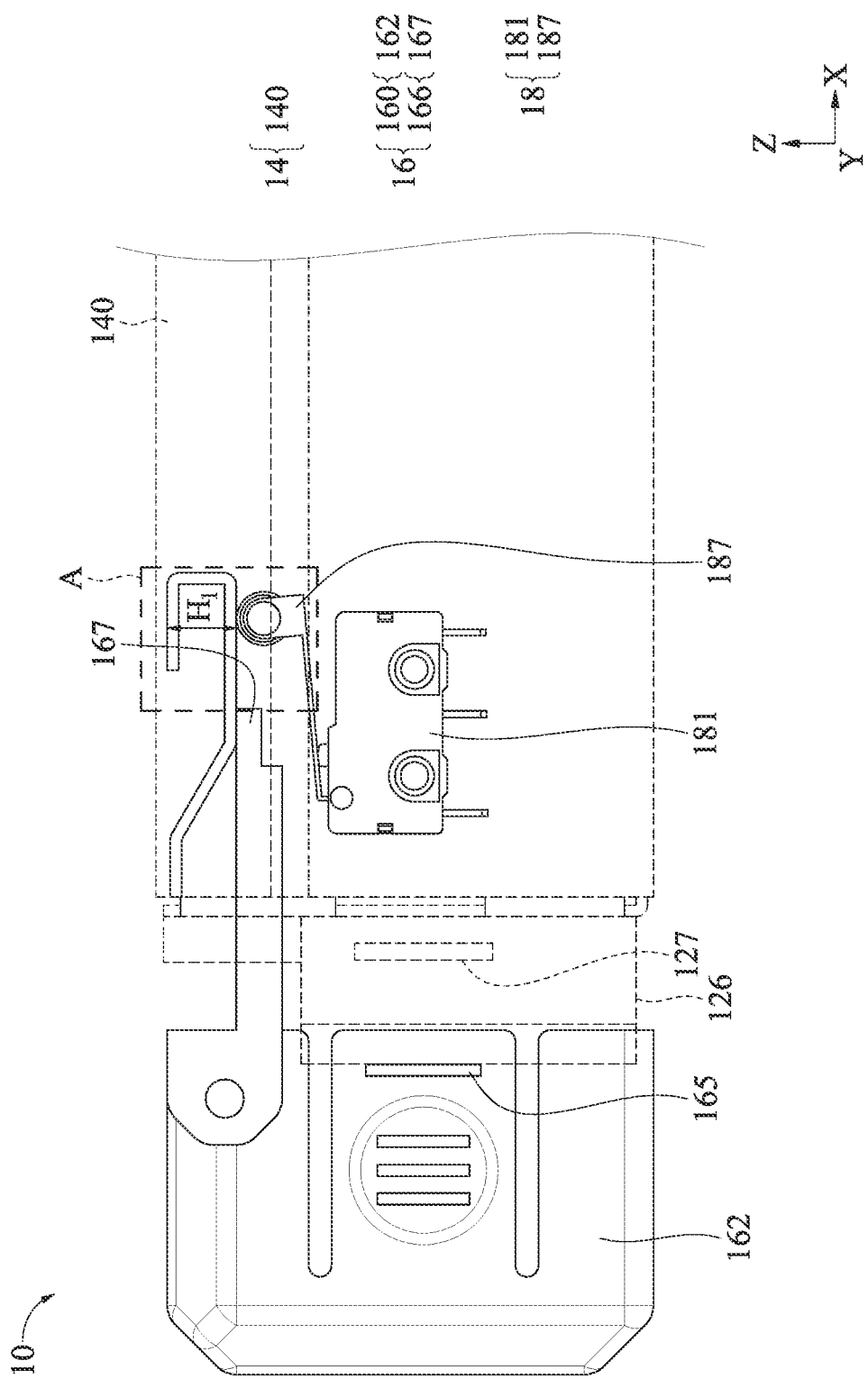
FIG. 4B illustrates a side perspective view of an electronic device according to some embodiments, wherein the electronic device is in a first opened state.
Figure 4C:
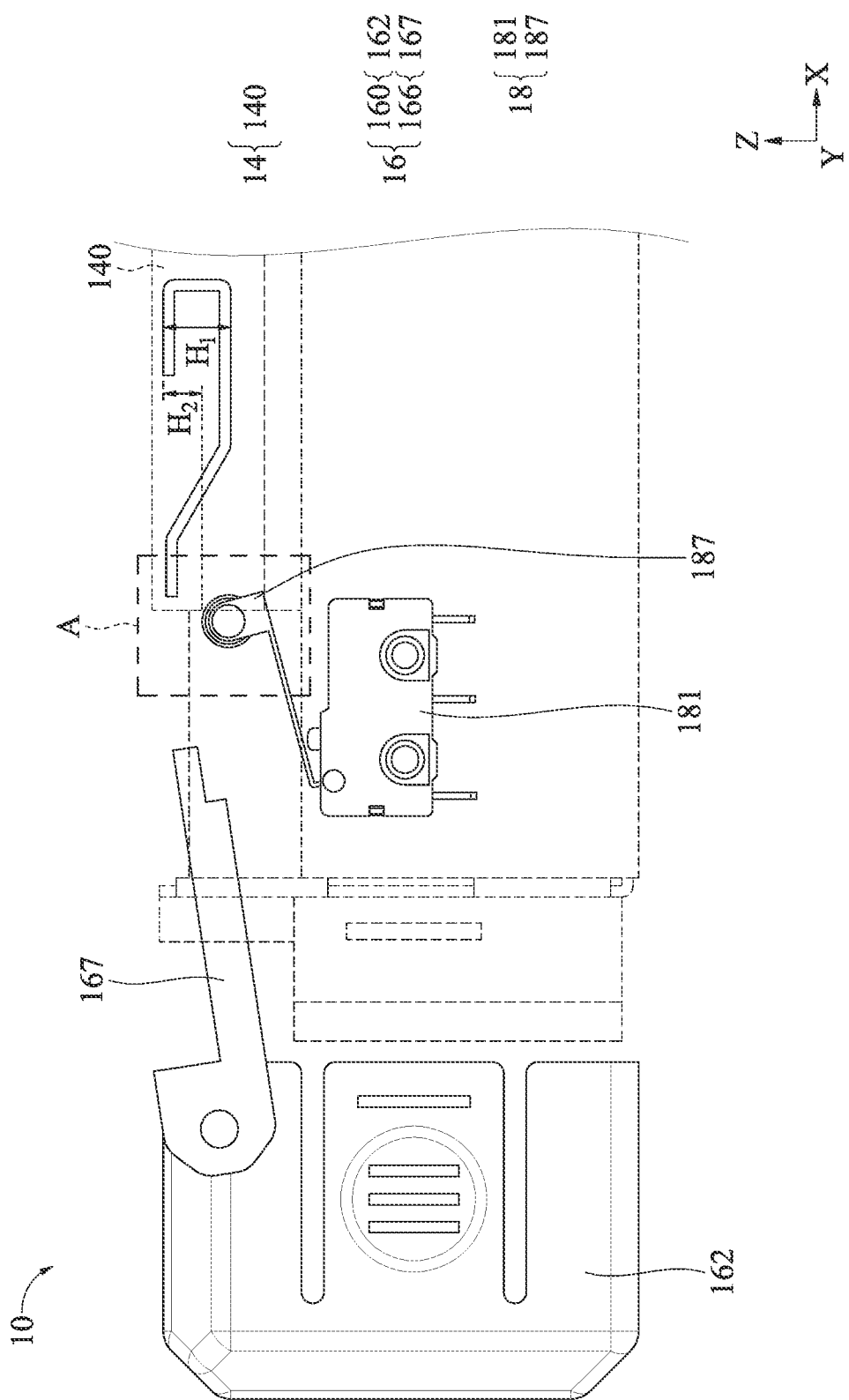
FIG. 4C illustrates a side perspective view of an electronic device according to some embodiments, wherein the electronic device is in a second opened state.
Figure 4D:
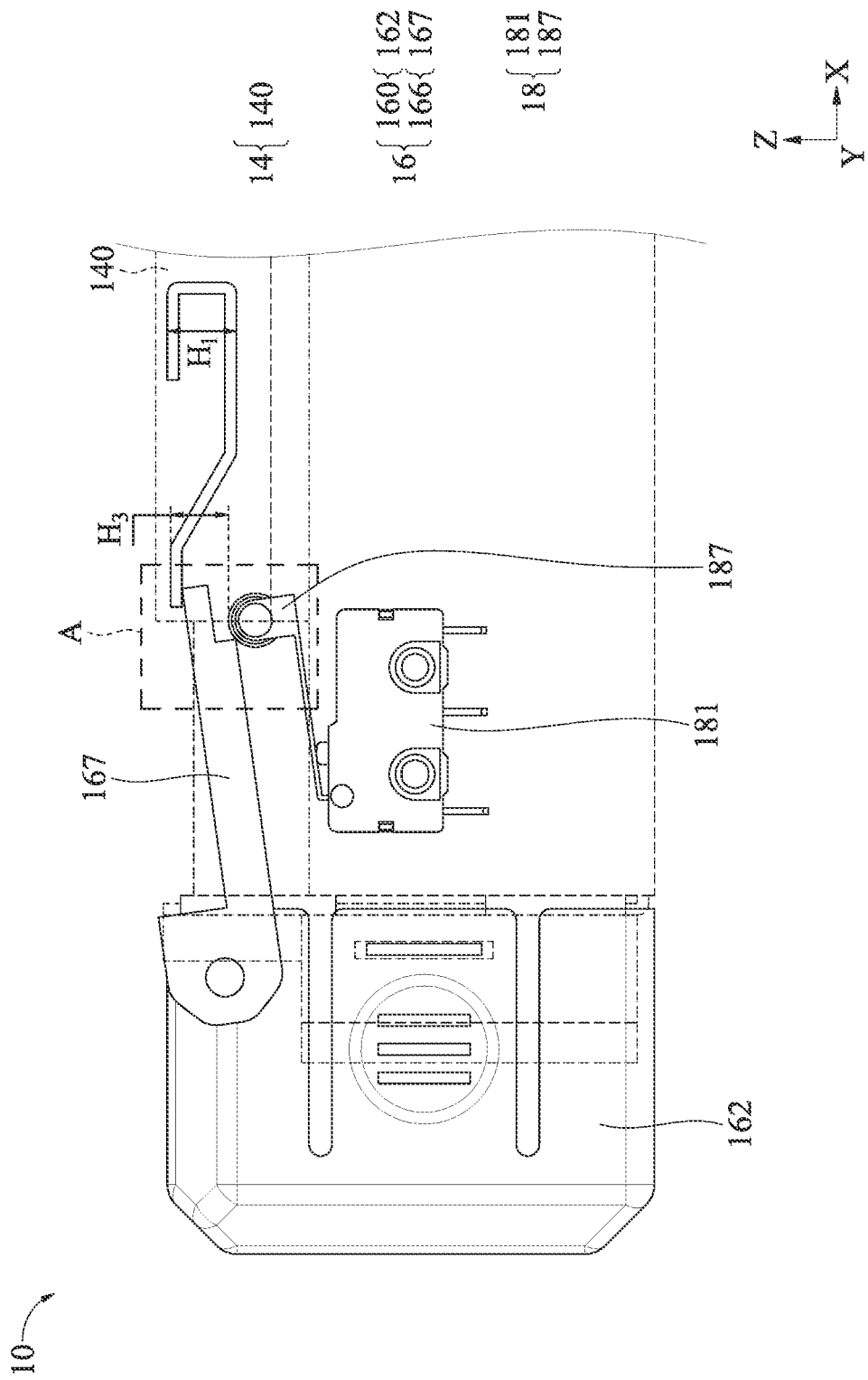
FIG. 4D illustrates a side perspective view of an electronic device according to some embodiments, wherein the electronic device is in a third opened state.

Please refer to FIG. 4A to FIG. 4D. FIG. 4B to FIG. 4D respectively illustrate side perspective views of electronic devices 10 according to some embodiments, wherein the electronic devices 10 are in a first opened state, a second opened state, and a third opened state. Each of the electronic devices 10 shown in FIG. 4A to FIG. 4D is an electronic device having three-stage opened states, where the electronic devices 10 shown in FIG. 4A to FIG. 4D are in "an unopened state" (that is, the state that both the top cover 14 and the side cover 16 are unopened), "a first opened state" (that is, the state that only the side cover 16 is opened), "a second opened state" (that is, the state that both the top cover 14 and the side cover 16 are opened), and "a third opened state" (that is, the state that only the top cover 14 is opened), respectively.

In some embodiments, the electronic device 10 can sense the unopened state, the first opened state, and the second opened state shown in FIG. 4A to FIG. 4C, which has been mentioned above and its implementations will thus not be further described herein.

The implementations of the third opened state shown in FIG. 4D are provided in the following embodiments, but the instant disclosure is not limited thereto.

According to some embodiments, the multi-stage sensor 18 comprises a sensing arm 187 extending from the multi-stage sensor 18 into the sensed area A, which has been described in detail as above and will thus not be further described herein. In FIG. 4D, in response to that only the side-sensed element 166 is in the sensed area A, the sensing arm 187 has a third sensed quantity. In response to that the sensing arm 187 has the third sensed quantity, the multi-stage sensor 18 outputs a third signal. For example, in the third opened state shown in FIG. 4D, the sensing arm 187 has a third sensed quantity being a third height $H_3$, and the third height $H_3$ is a distance between the top cover body 140 (for example, the top cover body 140 of the unopened state shown in FIG. 4A) and the surface of the sensing arm 187 that is away from the base 12. As mentioned above, in some embodiments, the third height $H_3$ is less than the first height $H_1$ (that is, the distance between the top-sensed element 142 and the top cover body 140). Through the engagement between the torsion spring 164 (shown in FIG. 2B; or the second shafting element 168 (shown in FIG. 2B)) and the side cover body 160, the side-sensed element 166 having the third height $H_3$ is restricted in the sensed area A and within a space between the top and the bottom of the first height $H_1$. In this way, the electronic device 10 according to some embodiments can sense the three-stage opened state of the top cover 14 and the side cover 16 not only according to the first sensed quantity and the second sensed quantity but also the third sensed quantity of the sensing arm 187 sensed by the multi-stage sensor 18.

Please refer to FIG. 4D again and FIG. 5. As mentioned above, in some embodiments, the multi-stage sensor 18 is a multi-stage sensing element; for example, the multi-stage sensing element is a multi-stage switch 181. In addition to the first stage switch $S_1$ and the second stage switch $S_2$ mentioned above, the multi-stage switch 181 further comprises a third stage switch $S_3$. In response to that the sensing arm 187 senses a third sensed quantity, the third stage switch $S_3$ is electrically conducted. For example, in FIG. 5, since the sensing arm 187 has the third height $H_3$ (shown in FIG. 4D) in the third opened state, the third stage switch $S_3$ of the multi-stage switch 181 is then electrically conducted correspondingly. For example, in response to that the third stage switch $S_3$ is electrically conducted, the signal of the third stage switch $S_3$ (which may be referred to as the third signal) sensed by the controlling unit 20 is ground, and the signals of the rest of the switches (such as the first stage switch $S_1$, the second stage switch $S_2$, and a fourth stage switch $S_4$, and the signals of these switches may be referred to as the first signal, the second signal, and the fourth signal, respectively) sensed by the controlling unit 20 are at high voltage levels (as shown as $V_{CC}$ in FIG. 5). In this way, the controlling unit 20 according to some embodiments can respectively sense and obtain the multi-stage opened state of the side cover 16 and the top cover 14.

Please refer to FIG. 4D again and FIG. 6. As mentioned above, in some embodiments, the multi-stage sensor 18 is a resistance-type sensing element; for example, the resistance-type sensing element is a variable resistance sensor 182. The variable resistance sensor 182 outputs a third signal according to the third sensed quantity of the sensing arm 187. For example, in FIG. 6, since the sensing arm 187 has the third height $H_3$ (shown in FIG. 4D) in the third opened state, the variable resistance sensor 182 have a third resistance $R_3$ corresponding to the third height $H_3$. The controlling unit 20 senses a divided voltage of the third resistance $R_3$ and a divided voltage of a fixed resistance R to learn whether the sensing arm 187 is in the third opened state. In this way, through the variable resistance sensor 182 of the multi-stage sensor 18 that senses the sensed resistances in the different multi-stage opened states, the electronic device 10 according to some embodiments can respectively sense the three-stage opened state of the top cover 14 and the side cover 16.

To sum up, according to some embodiments, since sensed quantities provided by two sensed elements that are in the sensed area and respectively disposed on two covers adjacent to each other (such as the above-mentioned top-sensed element and side-sensed element that correspond to the top cover and the side cover, respectively) can be sensed by a multi-stage sensor of an electronic device, whether the covers corresponding to the two sensed elements are respectively in the sensed area or not can be sensed and learned. In this way, whether the two adjacent covers are connected to each other or inadequately opened can be further learned by the electronic device. Further, in some embodiments, the identical multi-stage sensor can be utilized in an electronic device having a two-stage opened state or a three-stage opened state by simply modifying the connection manner among the covers, so that the facts that any one of the covers or the two connected covers are opened can be obtained. Accordingly, the electronic device can quickly transmit the signals corresponding to the different open states of the different covers back to a controlling unit so as to give the multi-stage sensor and/or the controlling unit (even the covers) further corresponding treatment, thereby avoiding unnecessary or even irreparable loss or damage to the electronic device itself or the contents loaded by the electronic device.

Although the present disclosure is disclosed in the foregoing embodiments as above, it is not intended to limit the present disclosure. Any person who is familiar with the relevant art can make some changes and modifications without departing from the spirit and scope of the present disclosure. Therefore, the scope of the present disclosure shall be subject to the definition of the scope of patent application attached to the specification.

What is claimed is:

1. An electronic device comprising:
   a base;
   a multi-stage sensor configured to sense a sensed area;
   a top cover comprising a top-sensed element, wherein the top cover is detachably connected to a top side of the base to have the top-sensed element be selectively in or not in the sensed area; and
   a side cover comprising a side-sensed element, wherein the side cover is detachably adjacent to a front side of the base to have the side-sensed element be selectively in or not in the sensed area;
   wherein the multi-stage sensor outputs a first signal in response to that only the top-sensed element is in the sensed area; and the multi-stage sensor outputs a second signal in response to that neither the top-sensed element nor the side-sensed element is in the sensed area.

2. The electronic device according to claim 1, wherein the top cover is slidably disposed on the base to have the top-sensed element be selectively in or not in the sensed area.

3. The electronic device according to claim 1, wherein the side cover comprises a side cover body pivotally connected to the top cover and connected to the side-sensed element, and the side cover body is pivotally rotatable with respect to the top cover to have the side-sensed element be selectively in or not in the sensed area.

4. The electronic device according to claim 1, wherein the side cover comprises a side cover body detachably connected to the front side of the base and connected to the side-sensed element, and the side cover body is movable with respect to the base to have the side-sensed element be selectively in or not in the sensed area.

5. The electronic device according to claim 4, wherein the multi-stage sensor comprises a sensing arm extending in the sensed area, the sensing arm has a first sensed quantity in response to that only the top-sensed element is in the sensed area, the sensing arm has a second sensed quantity in response to that neither the top-sensed element nor the side-sensed element is in the sensed area, the first sensed quantity is substantially different from the second sensed quantity, and the multi-stage sensor outputs the first signal and the second signal respectively in response to that the sensing arm has the first sensed quantity and the second sensed quantity.

6. The electronic device according to claim 5, wherein the multi-stage sensor is a multi-stage switch comprising a first stage switch and a second stage switch; the first stage switch is electrically conducted in response to that the sensing arm has the first sensed quantity, and the second stage switch is electrically conducted in response to that the sensing arm has the second sensed quantity.

7. The electronic device according to claim 5, wherein the multi-stage sensor is a variable resistance sensor, and the variable resistance sensor outputs the first signal and the second signal corresponding to the first sensed quantity and the second sensed quantity of the sensing arm according to the first sensed quantity and the second sensed quantity of the sensing arm.

8. The electronic device according to claim 4, wherein the multi-stage sensor is a light sensor, the light sensor is a light distance sensor, the light distance sensor emits an emitted light along a direction toward the top cover, and the light distance sensor outputs the first signal corresponding to a distance from the emitted light to the top-sensed element in response to that only the top-sensed element is in the sensed area.

9. The electronic device according to claim 8, wherein the light distance sensor comprises a light-emitting portion and a light-receiving portion, the light-emitting portion and the light-receiving portion are adjacent to each other and on a side of the light sensor adjacent to the top cover, the light-emitting portion emits the emitted light to a surface of the top-sensed element or a surface of the side-sensed element, and the light-receiving portion receives a reflected light reflected from the surface of the top-sensed element or the surface of the side-sensed element.

10. The electronic device according to claim 4, wherein the multi-stage sensor is a light sensor, and the light sensor is a light color sensor; the top-sensed element has a top element color, and the light color sensor emits an emitted light along a direction toward the top cover; in response to that only the top-sensed element is in the sensed area, the light color sensor receives a reflected light having a color similar to the top element color and the light color sensor outputs the first signal.

11. The electronic device according to claim 3, wherein the multi-stage sensor comprises a sensing arm extending in the sensed area, the sensing arm has a first sensed quantity in response to that only the top-sensed element is in the sensed area, the sensing arm has a second sensed quantity in response to that neither the top-sensed element nor the side-sensed element is in the sensed area, the first sensed quantity is substantially different from the second sensed quantity, and the multi-stage sensor outputs the first signal and the second signal respectively in response to that the sensing arm has the first sensed quantity and the second sensed quantity.

12. The electronic device according to claim 11, wherein the multi-stage sensor is a multi-stage switch comprising a first stage switch and a second stage switch; the first stage switch is electrically conducted in response to that the sensing arm has the first sensed quantity, and the second stage switch is electrically conducted in response to that the sensing arm has the second sensed quantity.

13. The electronic device according to claim 11, wherein the multi-stage sensor is a variable resistance sensor, and the variable resistance sensor outputs the first signal and the second signal corresponding to the first sensed quantity and the second sensed quantity of the sensing arm according to the first sensed quantity and the second sensed quantity of the sensing arm.

14. The electronic device according to claim 3, wherein the multi-stage sensor is a light sensor, the light sensor is a light distance sensor, the light distance sensor emits an emitted light along a direction toward the top cover, and the light distance sensor outputs the first signal corresponding to a distance from the emitted light to the top-sensed element in response to that only the top-sensed element is in the sensed area.

15. The electronic device according to claim 14, wherein the light distance sensor comprises a light-emitting portion and a light-receiving portion, the light-emitting portion and the light-receiving portion are adjacent to each other and on a side of the light sensor adjacent to the top cover, the light-emitting portion emits the emitted light to a surface of the top-sensed element or a surface of the side-sensed element, and the light-receiving portion receives a reflected light reflected from the surface of the top-sensed element or the surface of the side-sensed element.

16. The electronic device according to claim 3, wherein the multi-stage sensor is a light sensor, the light sensor is a light color sensor, the top-sensed element has a top element color, and the light color sensor emits an emitted light along a direction toward the top cover; in response to that only the top-sensed element is in the sensed area, the light color sensor receives a reflected light having a color similar to the top element color and the light color sensor outputs the first signal.

17. The electronic device according to claim 3, wherein the multi-stage sensor is a Hall sensor, the top-sensed element comprises a top magnet, and the side-sensed element comprises a side magnet; the Hall sensor outputs the first signal corresponding to a magnetic flux of the top magnet in response to that only the top-sensed element is in the sensed area.

18. The electronic device according to claim 4, wherein the multi-stage sensor is a Hall sensor, the top-sensed element comprises a top magnet, and the side-sensed element comprises a side magnet; the Hall sensor outputs the first signal corresponding to a magnetic flux of the top magnet in response to that only the top-sensed element is in the sensed area, and the Hall sensor outputs a third signal corresponding to a magnetic flux of the side magnet in response to that only the side-sensed element is in the sensed area.

19. The electronic device according to claim 18, wherein the magnetic flux of the top magnet is substantially different from the magnetic flux of the side magnet.

20. The electronic device according to claim 4, wherein the side-sensed element is pivotally connected to the side cover body.

21. The electronic device according to claim 20, wherein the multi-stage sensor comprises a sensing arm extending in the sensed area, the sensing arm has a first sensed quantity in response to that only the top-sensed element is in the sensed area, and the sensing arm has a second sensed quantity in response to that neither the top-sensed element nor the side-sensed element is in the sensed area, and the sensing arm has a third sensed quantity in response to that only the side-sensed element is in the sensed area; the first sensed quantity, the second sensed quantity, and the third sensed quantity are substantially different from each other, and the multi-stage sensor outputs the first signal, the second signal, and a third signal respectively in response to that the sensing arm has the first sensed quantity, the second sensed quantity, and the third sensed quantity.

22. The electronic device according to claim 21, wherein the multi-stage sensor is a multi-stage switch comprising a first stage switch, a second stage switch, and a third stage switch; the first stage switch is electrically conducted in response to that the sensing arm has the first sensed quantity, the second stage switch is electrically conducted in response to that the sensing arm has the second sensed quantity, and the third stage switch is electrically conducted in response to that the sensing arm has the third sensed quantity.

23. The electronic device according to claim 21, wherein the multi-stage sensor is a variable resistance sensor, and the variable resistance sensor outputs the first signal, the second signal, and the third signal corresponding to the first sensed quantity, the second sensed quantity, and the third sensed quantity of the sensing arm according to the first sensed quantity, the second sensed quantity, and the third sensed quantity of the sensing arm.

24. The electronic device according to claim 20, wherein the multi-stage sensor is a light sensor, the light sensor is a light distance sensor, and the light distance sensor emits an emitted light along a direction toward the top cover; the light distance sensor outputs the first signal corresponding to a distance between the emitted light and top-sensed element in response to that only the top-sensed element is in the sensed area, and the light distance sensor outputs a third signal corresponding to a distance of the emitted light to the side-sensed element in response to that only the side-sensed element is in the sensed area.

25. The electronic device according to claim 20, wherein the multi-stage sensor is a Hall sensor, the top-sensed element comprises a top magnet, and the side-sensed element comprises a side magnet; the Hall sensor outputs the first signal corresponding to a magnetic flux of the top magnet in response to that only the top-sensed element is in the sensed area, and the Hall sensor outputs a third signal corresponding to a magnetic flux of the side magnet in response to that only the side-sensed element is in the sensed area.

26. The electronic device according to claim 25, wherein the magnetic flux of the top magnet is substantially different from the magnetic flux of the side magnet.

* * * * *